(12) United States Patent
Cho

(10) Patent No.: US 9,767,903 B2
(45) Date of Patent: Sep. 19, 2017

(54) NONVOLATILE MEMORY MODULE HAVING DUAL-PORT DRAM

(71) Applicant: SAMSUNG ELECTRONICS CO., LTD., Suwon-si, Gyeonggi-Do (KR)

(72) Inventor: Youngjin Cho, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/260,932

(22) Filed: Sep. 9, 2016

(65) Prior Publication Data

US 2017/0075576 A1    Mar. 16, 2017

(30) Foreign Application Priority Data

Sep. 11, 2015    (KR) .................. 10-2015-0128932

(51) Int. Cl.
| | |
|---|---|
| *G11C 8/00* | (2006.01) |
| *G11C 14/00* | (2006.01) |
| *G06F 12/00* | (2006.01) |
| *G06F 11/14* | (2006.01) |
| *G11C 5/04* | (2006.01) |
| *G11C 8/16* | (2006.01) |
| *G11C 11/00* | (2006.01) |
| *G11C 5/14* | (2006.01) |
| *G11C 7/14* | (2006.01) |

(52) U.S. Cl.
CPC .......... *G11C 14/0018* (2013.01); *G06F 11/14* (2013.01); *G06F 12/00* (2013.01); *G11C 5/04* (2013.01); *G11C 8/16* (2013.01); *G11C 11/005* (2013.01); *G11C 5/143* (2013.01); *G11C 7/14* (2013.01)

(58) Field of Classification Search
CPC ..... G11C 14/0018; G11C 11/005; G11C 5/04; G11C 8/16; G06F 11/14; G06F 12/00
See application file for complete search history.

(56) References Cited

U.S. PATENT DOCUMENTS

| | | |
|---|---|---|
| 6,445,638 B1 | 9/2002 | Hsu et al. |
| 7,349,285 B2 | 3/2008 | Balasubramanian et al. |
| 7,529,139 B2 | 5/2009 | Huang et al. |
| 7,533,222 B2 | 5/2009 | Leung |
| 7,554,830 B2 * | 6/2009 | Miura ...................... G11C 5/02 365/230.01 |

(Continued)

*Primary Examiner* — Pho M Luu
(74) *Attorney, Agent, or Firm* — Volentine & Whitt, PLLC

(57) ABSTRACT

A memory module includes a nonvolatile memory device and a volatile memory device connected to a first data channel through a first input/output port and to a second data channel through a second input/output port. The volatile memory device activates one of the first and second input/output ports based on an operation mode. The memory module includes a registering clock driver that transmits a first control signal for data exchange through the first input/output port and a second control signal for data exchange through the second input/output port, to the volatile memory device. A memory controller of the memory module generates the second control signal, exchanges data with the volatile memory device through the second data channel, and controls the nonvolatile memory device. The memory controller detects a request from a host or a power status and generates the second control signal based on the detection result.

20 Claims, 25 Drawing Sheets

(56) References Cited

U.S. PATENT DOCUMENTS

| | | |
|---|---|---|
| 7,606,982 B2 | 10/2009 | Hwang et al. |
| 7,679,133 B2 | 3/2010 | Son et al. |
| 8,301,833 B1 | 10/2012 | Chen et al. |
| 8,427,891 B2 | 4/2013 | Best |
| 8,468,317 B2 * | 6/2013 | Steed ................. G06F 11/1441 711/103 |
| 8,553,466 B2 | 10/2013 | Han et al. |
| 8,559,235 B2 | 10/2013 | Yoon et al. |
| 8,654,587 B2 | 2/2014 | Yoon et al. |
| 8,874,831 B2 | 10/2014 | Lee et al. |
| 9,195,602 B2 * | 11/2015 | Hampel ................. G06F 12/08 |
| 9,436,600 B2 * | 9/2016 | Lee ..................... G06F 12/0246 |
| 9,569,144 B2 * | 2/2017 | Uematsu ................. G11C 5/04 |
| 2011/0233648 A1 | 9/2011 | Seol et al. |
| 2013/0019076 A1 | 1/2013 | Amidi et al. |
| 2014/0365715 A1 | 12/2014 | Lee |

\* cited by examiner

NONVOLATILE MEMORY MODULE HAVING DUAL-PORT DRAM

CROSS-REFERENCE TO RELATED APPLICATIONS

A claim for priority under 35 U.S.C. §119 is made to Korean Patent Application No. 10-2015-0128932 filed Sep. 11, 2015, in the Korean Intellectual Property Office, the entire contents of which are hereby incorporated by reference.

BACKGROUND

Embodiments of the disclosure described herein relate to a semiconductor memory, and more particularly, relate to a nonvolatile memory module including a dual-port DRAM.

A semiconductor memory refers to a memory device that is implemented using semiconductor such as silicon (Si), germanium (Ge), gallium arsenide (GaAs), indium phosphide (InP), or the like. A semiconductor memory device is roughly divided into a volatile memory device and a nonvolatile memory device.

A volatile memory device refers to a memory device which loses data stored therein at power-off. The volatile memory device includes a static random access memory (SRAM), a dynamic ram (DRAM), a synchronous DRAM or the like. A nonvolatile memory device refers to a memory device which retains data stored therein even at power-off. The nonvolatile memory device includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), or the like.

The flash memory device is widely used as a storage device by virtue of advantages such as large capacity, low noise, low power, and the like. In particular, a solid state drive (SSD) which is based on a flash memory is used as mass storage in a personal computer, a notebook, a workstation, a server system, and the like. Typical SSD devices are connected with a computing system based on a SATA interface or a PCI-express interface. However, as the amount of data processed on a computing system increases, data throughput becomes greater than the data bandwidth or communication speed of an interface connected with the SSD devices, thereby causing data bottleneck. Since the data bottleneck causes a decrease in the performance of the computing system, various techniques are being developed to improve the performance.

SUMMARY

Embodiments of the disclosure provide a memory module capable of easily backing-up data of a volatile memory in a nonvolatile memory and a data back-up method thereof.

One aspect of embodiments of the disclosure is directed to provide a memory module including a nonvolatile memory device and a volatile memory device. The volatile memory device is connected to a first data channel through a first input/output port and to a second data channel through a second input/output port and configured to activate one of the first and second input/output ports based on an operation mode. A registering clock driver (RCD) is configured to transmit at least one of a first control signal for data exchange through the first input/output port and a second control signal for data exchange through the second input/output port, to the volatile memory device. A memory controller is configured to generate the second control signal, to exchange data with the volatile memory device through the second data channel, and to control the nonvolatile memory device. The memory controller detects a request from a host or a power status and generates the second control signal with reference to the detection result so as to activate the second input/output port of the volatile memory device.

Another aspect of embodiments of the disclosure is directed to provide a memory module including a nonvolatile memory device. A dual-port DRAM is configured to activate one of first and second input/output ports for data input/output based on an operation mode. A data buffer is configured to connect the first input/output port to a main channel for data exchange with a host or the second input/output port to a back-up channel for back-up or restore. A memory controller is configured to exchange back-up data with the nonvolatile memory device through the back-up channel. A registering clock driver is configured to selectively provide a command/address provided from the memory controller or the host to the dual-port DRAM based on the operation mode. The registering clock driver generates a buffer command for controlling a delay or transmission characteristic of the data buffer based on the operation mode.

Still another aspect of embodiments of the disclosure is directed to provide a back-up method of a nonvolatile memory module comprising a nonvolatile memory device, a memory controller for controlling the nonvolatile memory device, and a DRAM. The method includes detecting a back-up request, activating one of first and second input/output ports of the DRAM based on the detection result, inputting a command/address for outputting back-up data to the DRAM at the memory controller, and receiving the back-up data through the second input/output port and writing the received back-up data at the nonvolatile memory device. Data transfer rates of the first and second input/output ports are set to be different from each other.

Still another aspect of embodiments of the disclosure is directed to provide a volatile random access memory (RAM) having an array of memory cells that store data. A first input/output port communicates data with a host device according to a transmission bandwidth of the random access memory. A second input/output port communicates data with a nonvolatile memory (NVM) controller according to a transmission bandwidth of a nonvolatile memory device that is controlled by the nonvolatile memory controller. A RAM controller communicates data between the memory cell array and the host device through the first input/output port in response to receiving a first command and communicates data between the memory cell array and the NVM controller in response to receiving a second command that differs from the first command.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
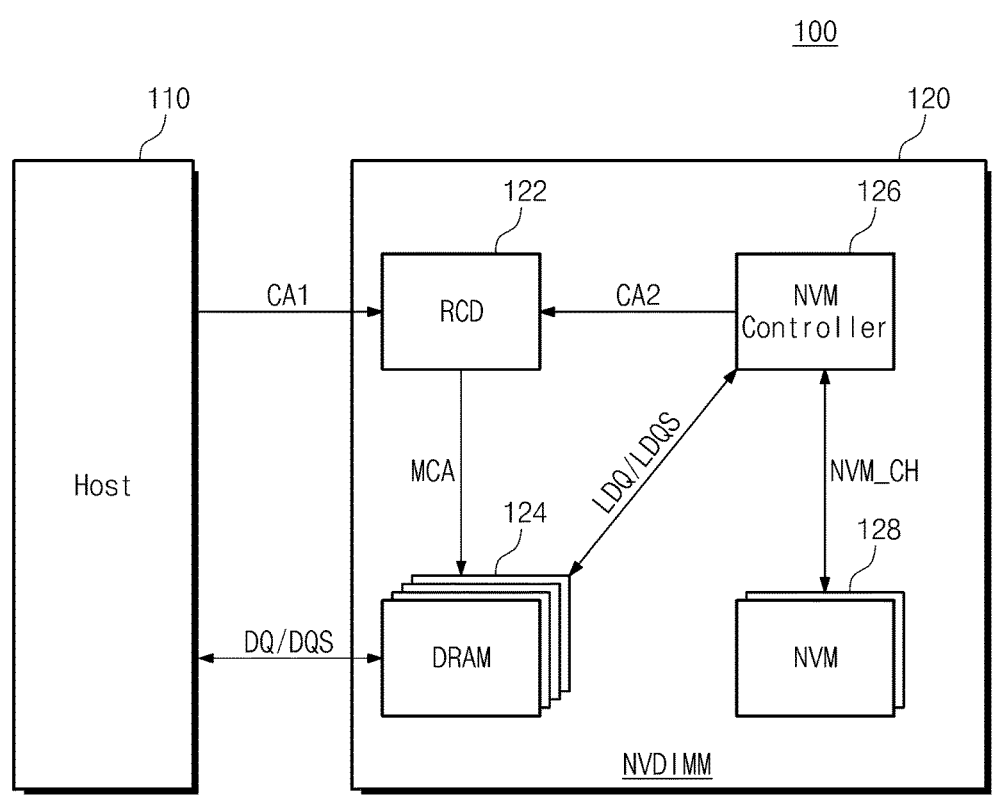
FIG. 1 is a block diagram illustrating a user device according to an embodiment of the disclosure.

Now hereinafter will be described exemplary embodiments of the disclosure in conjunction with accompanying drawings. In the following description, the detailed configurations and structures such as the details are simply provided to assist a thorough understanding of the embodiments of the present disclosure. Thus, modifications to the embodiments described in the body without departing from the spirit and scope of the present disclosure can be carried out by those skilled in the art.

In addition, description of well-known functions and construction are omitted for clarity and conciseness. The terms used herein are defined in consideration of functions of the present disclosure and are not limited to a specific function. Definition of terms may be determined based on the information described in the description.

A module in the drawings or the following description may be in addition to the components described in the description or shown in the drawings and connected to the others. The connection between the modules or components may be direct or non-direct. The connection between the modules or components may be by communication or physical connection. Unless otherwise defined, all terms, including technical or scientific sense used in this paper have the meaning which can be understood by those skilled in the art in the art. In general, the term as defined in the dictionary is interpreted to have a meaning equivalent to the contextual meaning in the relevant field of art. Unless clearly defined so in the text, it shall not be interpreted to have ideal or excessively formal meanings.

A nonvolatile memory system according to an embodiment of the disclosure may perform a flush operation in response to an activated save signal. While the flush operation is performed, the nonvolatile memory system may maintain an active state of the save signal. After the flash operation is terminated, the nonvolatile memory system may inactivate the save signal. Based on the inactivation of the save signal, a processor connected with the nonvolatile memory system may recognize that the flush operation of the nonvolatile memory system is completed. Accordingly, embodiments of the disclosure provide a nonvolatile memory system with improved performance and an operation method thereof.

FIG. 1 is a block diagram illustrating a user device according to an embodiment of the disclosure. Referring to FIG. 1, a user device 100 may include a host 110 and a nonvolatile memory module 120.

The host 110 may process data or may control components included in the user device 100. For example, the host 110 may drive various operating systems (OS) and may execute various applications on an operating system (OS). The host 110 may write data at the nonvolatile memory module 120 or may read data stored therein.

The host 110 may request the nonvolatile memory module 120 to perform a back-up operation. For example, the host 110 may detect an internal status or a power status of the host and may request the nonvolatile memory module 120 to perform a back-up operation. The host 110 may request the nonvolatile memory module 120 to perform the back-up operation using a command/address CA1. Alternatively, the host 110 may request the nonvolatile memory module 120 to perform the back-up operation using an independent control signal. In addition, the host 110 may request the back-up operation from the nonvolatile memory module 120 using data DQ provided through a data bus or using an independent serial interface.

The nonvolatile memory module 120 may store data in a DRAM 124 or in a nonvolatile memory 128 in response to a request of the host 110. The nonvolatile memory module 120 may back-up data stored in the DRAM 124 in the nonvolatile memory 128 in response to the request of the host 110 or through a power status internally detected by the nonvolatile memory module 120. To this end, the nonvolatile memory module 120 may include a registering clock driver (hereinafter, referred to as "RCD") 122, the DRAM 124, a NVM controller 126, and the nonvolatile memory 128.

The RCD 122 may buffer a command/address CA1 which the host 110 provides. Furthermore, the RCD 122 may transmit the buffered command/address CA1 as a memory command/address MCA to the DRAM 124. In addition, the RCD 122 may buffer a command/address CA2 provided from the NVM controller 126 and may transmit the buffered command/address CA2 as the memory command/address MCA to the DRAM 124. The command/address CA1 provided by the host 110 may be provided to the DRAM 124 on a priority basis. However, when the command/address CA2 is provided from the NVM controller 126, the command/address CA1 provided from the host 100 may be held.

Moreover, although not shown, the RCD 122 may sequentially provide a command to a data buffer (hereinafter, referred to as "DB"), which is placed in front of the DRAM 124, if needed. The RCD 122 may buffer a control signal CTRL provided from the host 110 and may provide the buffered control signal to the DRAM 124 or a target device. For example, in an embodiment, the RCD 122 may transmit a back-up control signal SAVE_n provided from the host 110 to the NVM controller 126.

The DRAM 124 may exchange data with the host 100 through a data line DQ/DQS of a main channel. In addition, the DRAM 124 may exchange data with the NVM controller 126 through a data line LDQ/LDQS of a back-up channel which is activated during a back-up operation. During a normal operation, the DRAM 124 may receive or output data from or to the host 110 using the data line DQ/DQS. The main channel may include, for example, signal lines for transmitting a data signal DQ and a data strobe signal DQS.

Here, the main channel may include, for example, at least one of double data rate (DDR), DDR2, DDR3, DDR4, low power DDR (LPDDR), universal serial bus (USB), multimedia card (MMC), embedded MMC, peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), firewire, universal flash storage (UFS), nonvolatile memory express (NVMe), or the like.

The NVM controller 126 may determine the need to back up data stored in the DRAM 124. Whether a back-up operation is required may be provided to the NVM controller 126 by a control signal or a command provided from the host 110. In an embodiment, the NVM controller 126 may determine whether the back-up operation is required, by monitoring a level of a voltage provided to the nonvolatile memory module 120. When the back-up operation begins, the NVM controller 126 may transmit the command/address CA2 to the RCD 122. The RCD 122 may transmit the memory command/address MCA to the DRAM 124 in response to the command/address CA2. In this case, back-up data may be outputted from the DRAM 124 through a back-up channel, and the outputted back-up data may be transmitted to the NVM controller 126 through the data line LDQ/LDQS. Afterwards, the back-up data may be programmed by the NVM controller 126 at the nonvolatile memory 128.

The nonvolatile memory 128 may be connected with the NVM controller 126 through an NVM channel NVM_CH. The nonvolatile memory 128 may include, for example, one or more flash memories. Under control of the NVM controller 126, the nonvolatile memory 128 may program the back-up data or may output the data that is backed up. In an example embodiment, the nonvolatile memory 128 may be implemented with nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), a spin-torque magnetic RAM (STT-MRAM), and the like. For descriptive convenience, it may be assumed that the nonvolatile memory 128 is the NAND flash memory.

In an example embodiment, the nonvolatile memory 128 may include a 3-dimensional memory array. The 3-dimensional memory array may be monolithically formed in one or more physical level(s) of a memory cell array having an active region arranged on a circuit related to a silicon substrate and an operation of memory cells. The circuit related to an operation of memory cells may be located in a substrate or on a substrate. The term "monolithic" means that layers of each level of the 3-dimensional memory array are directly deposited on the layers of each underlying level of the array.

According to an example embodiment of the disclosure, the 3-dimensional memory array may have a vertical-directional characteristic and may include vertical NAND strings in which at least one memory cell is located on another memory cell. At least one memory cell may include a charge trap layer. Each of the vertical NAND strings may include at least one selection transistor which is located on memory cells. At least one selection transistor may have the same structure as the memory cells, and may be monolithically formed together with the memory cells.

The following patent documents, which are hereby incorporated by reference, describe suitable configurations for 3-dimensional memory arrays, in which the 3-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

According to the above-described user device 100, the nonvolatile memory module 120 may include the DRAM 124 which has the main channel for exchanging data with the host 110 and the back-up channel for transmitting the back-up data. During a normal operation, the nonvolatile memory module 120 may exchange data with the host 110 through the main channel. The nonvolatile memory module 120 may recognize an event, such as occurrence of a power error, through a control of the host 110 or through internal (or automatic) monitoring thereof and may back-up data loaded onto the DRAM 124 in the nonvolatile memory 128.

In an example embodiment, although not shown, the nonvolatile memory module 120 may be of the form of a dual in-line memory module (DIMM) (e.g., NVDIMM) and may be mounted on a DIMM socket electrically or directly connected with the host 110. In addition, the user device 100 may include one of a computer, a portable computer, an ultra-mobile personal computer (UMPC), a workstation, a server computer, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device capable of transmitting or receiving information in a wireless environment, and various electronic devices including a home network.

Figure 2:
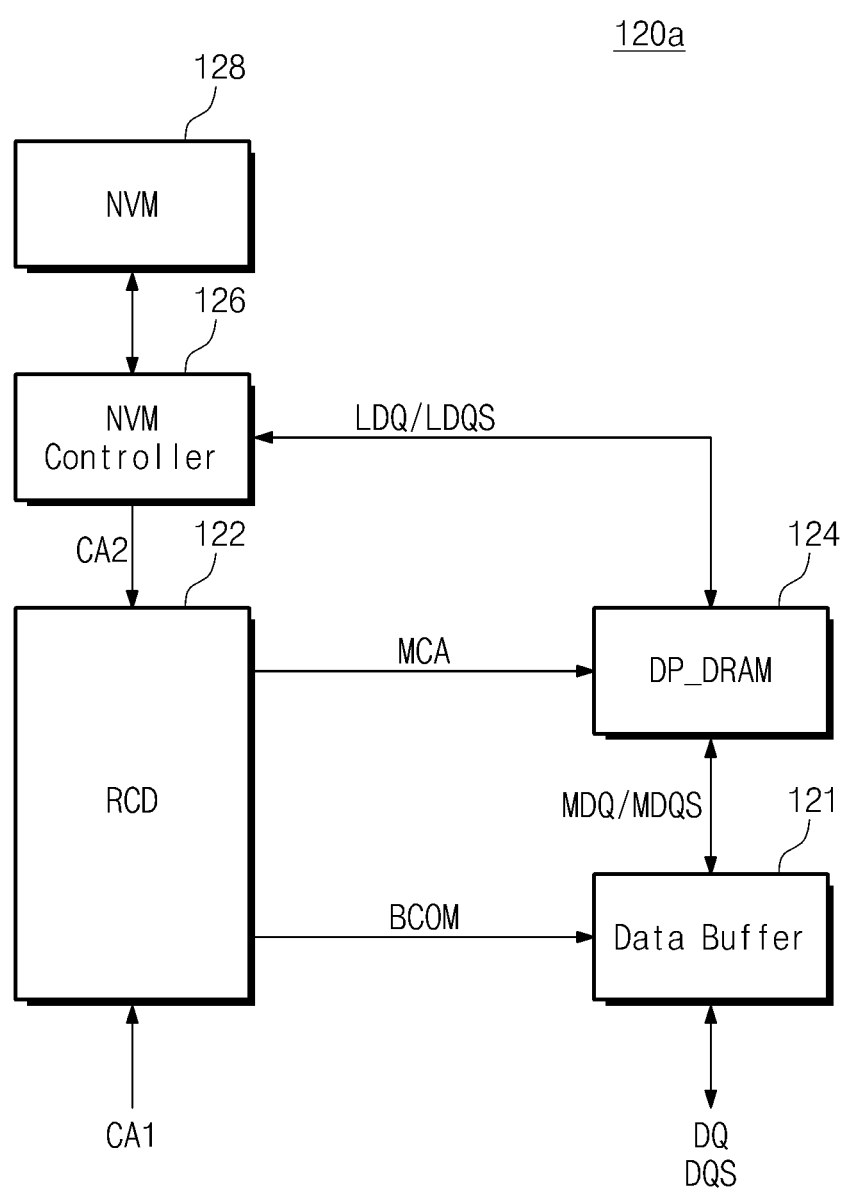
FIG. 2 is a block diagram illustrating a nonvolatile memory module illustrated in FIG. 1.

FIG. 2 is a block diagram illustrating a nonvolatile memory module illustrated in FIG. 1. Referring to FIG. 2, a nonvolatile memory module 120a may include the RCD 122, the DRAM 124, the NVM controller 126, and the nonvolatile memory 128. Additionally, the nonvolatile memory module 120a may further include a data buffer 121 between the dual-port DRAM 124 and the host 110.

The data buffer 121 may receive data from the host 110 through a data signal DQ and a data strobe signal DQS and may transmit the received signal to the dual-port DRAM 124. Alternatively, the data buffer circuit 121 may receive data from the dual-port DRAM 124 and may transfer the received data to the host 110 through the data signal DQ and the data strobe signal DQS. The nonvolatile memory module 120a may control a delay of the data signal DQ or the data strobe signal DQS through the data buffer 121, thereby making high reliability. During an initial operation, the nonvolatile memory module 120a may control the data buffer 121 using a buffer command BCOM provided through the RCD 122. It may be understood that the data buffer 121 is omitted according to a configuration of the memory module.

The RCD 122 may receive the command/address CA1 provided from the host 110 (not illustrated) or the control signal CTRL and may transmit the received command/address CA1 as a memory command/address MCA to the dual-port DRAM 124. The dual-port DRAM 124 may exchange data with the host 110 in response to the memory command/address MCA provided from the RCD 122. Here, the dual-port DRAM 124 may exchange the data signal DQ and the data strobe signal DQS with the host 110 through the data buffer 121 disposed between the dual-port DRAM 124 and the host 110. The RCD 122 may provide a command BCOM for controlling the data buffer 121. In addition, the RCD 122 may receive a command/address CA2 from the NVM controller 126 or the control signal CTRL and may transmit the received command/address or control signal CA2 or CTRL as the memory command/address MCA to the dual-port DRAM 124. The dual-port DRAM 124 may exchange data with the host 110 in response to the memory command/address MCA provided from the RCD 122.

The dual-port DRAM 124 may include at least two data input/output ports respectively connected to main and back-up channels. The main channel may be a channel for exchanging data with host 110. The main channel may include data lines MDQ and MDQS, which are connected to the data buffer 121, and data lines DQ and DQS between the host 110 and the data buffer 121. The back-up channel may be a data channel provided between the dual-port DRAM 124 and the NVM controller 126. The back-up channel may include, for example, data lines LDQ and LDQS. Compared with a bandwidth or a transmit rate of the main channel, a bandwidth or a transmit rate of the back-up channel may be provided to be relatively small or slow.

The NVM controller 126 may activate a back-up operation under control of the host 110 or through a result (or operation) monitored thereby. Information for requiring the back-up operation through a command or a control signal from the host 110 or through various manners may be provided to the NVM controller 126 through the RCD 122 or directly. In addition, the nonvolatile memory module 120a may detect a level of a power supply voltage supplied thereto and may determine occurrence of a power error based on the detection result. When the back-up operation is activated, the NVM controller 126 may request an output of the back-up data by transmitting the command/address CA2 to the dual-port DRAM 124. Furthermore, the NVM controller 126 may receive data, outputted from the dual-port DRAM 124, via the data lines LDQ and LDQS constituting the back-up channel Afterwards, the back-up data may be programmed at the nonvolatile memory 128.

According to the above-described nonvolatile memory module 120, the dual-port DRAM 124 may include the main channel for exchanging data with the host 110 and the back-up channel for back-up. In addition, the nonvolatile memory module 120 may operate as a DRAM module during a normal operation; when power is removed or a power error occurs, the nonvolatile memory module 120 may back-up data being used in the nonvolatile memory 128. Thus, the nonvolatile memory module 120 may operate as a DRAM module accessible in high speed, and the nonvolatile memory module 120 may have a nonvolatile characteristic in which data being driven is retained even when power is removed.

Figure 3:
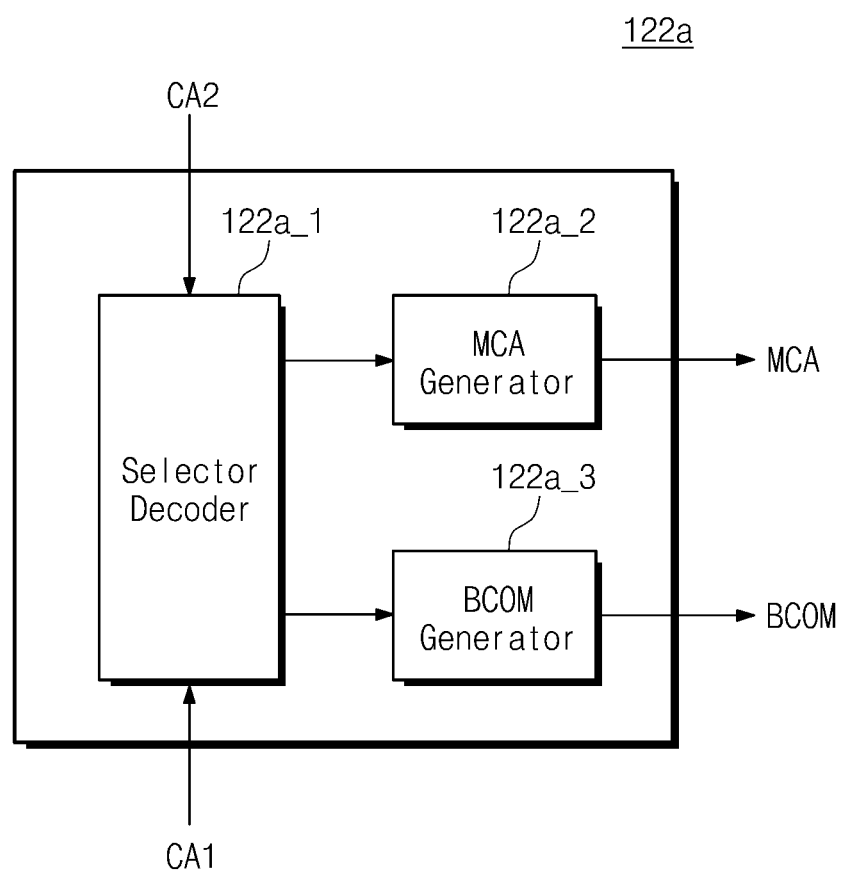
FIG. 3 is a block diagram illustrating an RCD structure of FIG. 2.

FIG. 3 is a block diagram illustrating an RCD structure of FIG. 2. Referring to FIG. 3, an RCD 122a may have two ports (e.g., dual-port) and may include a selector 122a_1, a memory command/address generator 122a_2, and a buffer command generator 122a_3.

The selector 122a_1 may select one of the command/address CA1 supplied from the host 110 and the command/address CA2 provided by the NVM controller 126. However, during a normal operation, the selector 122a_1 may transmit the command/address CA1 provided from the host 110 to the MCA generator 122a_2. Meanwhile, when a back-up request is generated from the host 110 or the NVM controller 126, the selector 122a_1 may be set to transmit the command/address CA2 provided from the NVM controller 126 to the MCA generator 122a_2. Moreover, the selector 122a_1 may control the BCOM generator 122a_3 based on the selected command/address CA.

The MCA generator 122a_2 may generate the memory command/address MCA corresponding to one, which is to be transmitted, from among the command/addresses CA1 and CA2. When the dual-port DRAM 124 is provided in plural, the MCA generator 122a_2 may transmit the generated memory command/address MCA to each of the plurality of dual-port DRAMs 124.

The BCOM generator 122a_3 may generate a buffer command BCOM corresponding to one, which is to be transmitted, from among the command/addresses CA1 and CA2. The delay characteristics of a plurality of data buffers 121 and a signal generation characteristic may be initialized or adjusted through the buffer command BCOM. When the command/address CA2 provided from the NVM controller 126 is selected, the BCOM generator 122a_3 may perform an initial operation for transmitting or receiving data to/from the signal lines LDQ and LDQS of the back-up channel. On the other hand, when the command/address CA1 provided from the host 110 is selected, the BCOM generator 122a_3 may perform an initial operation for transmitting or receiving data to/from the signal lines MDQ and MDQS of the main channel.

The RCD 122a described above is only an example of the RCD 122 of FIG. 2 included in the nonvolatile memory module 120 of the disclosure. It may be understood that the RCD 122 is configured to select one of the command/addresses CA1 and CA2 and transmit the selected command/address to the dual-port DRAM 124.

Figure 4:
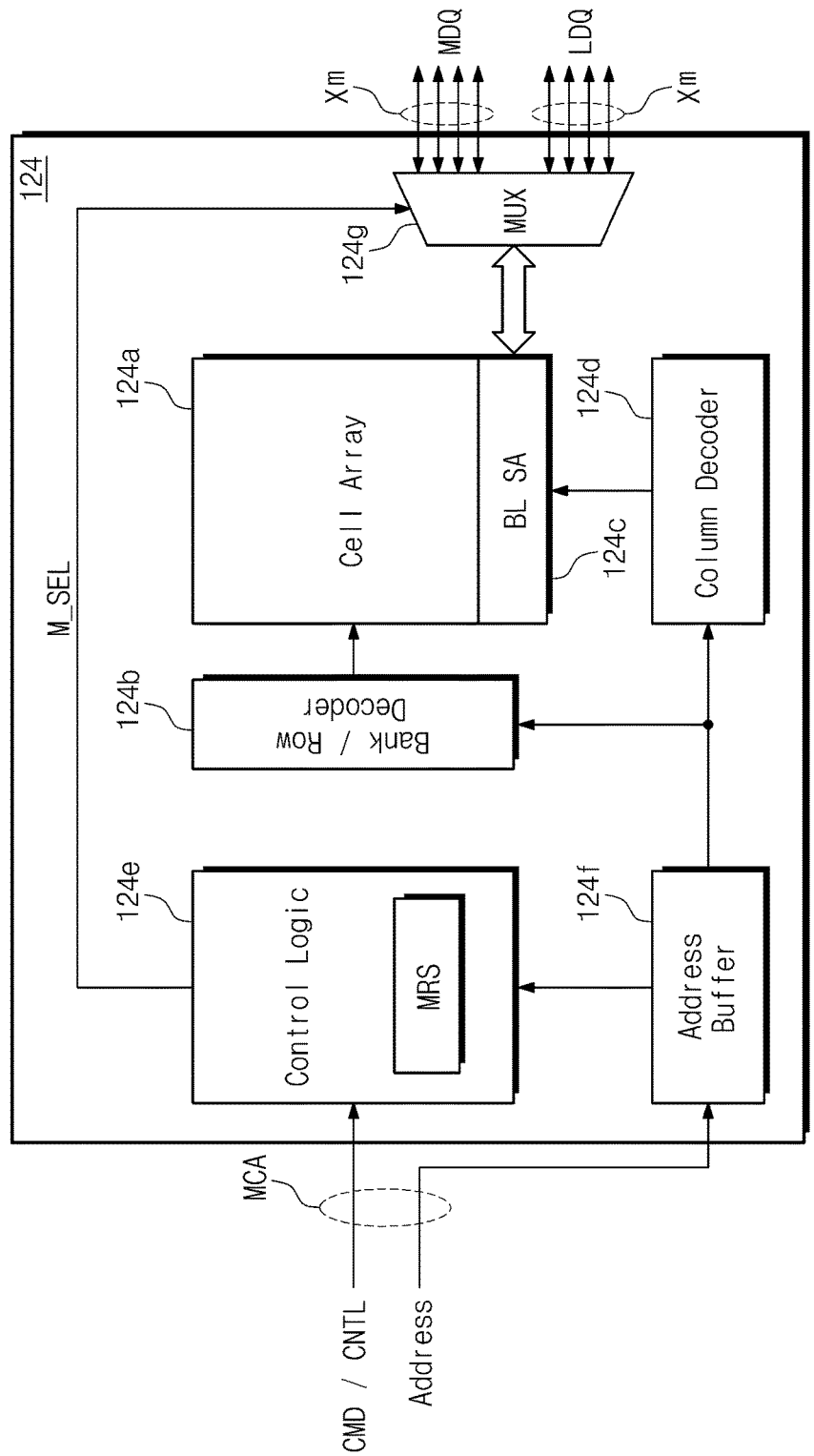
FIG. 4 is a block diagram illustrating a structure of a dual-port DRAM according to an embodiment of the disclosure.

FIG. 4 is a block diagram illustrating a structure of a dual-port DRAM according to an embodiment of the disclosure. Referring to FIG. 4, the dual-port DRAM 124 according to an embodiment of the disclosure may include a cell array 124a, a bank/row decoder 124b, a sense amplifier 124c, a column decoder 124d, control logic 124e, an address buffer 124f, and a multiplexer 124g for selecting input/output ports based on an operation mode.

The cell array 124a may include a plurality of memory cells which are connected to word lines and bit lines and are arranged along row and column directions. Each of the memory cells may be composed of a cell capacitor and an access transistor. A gate of the access transistor may be connected to one of the word lines arranged in the row direction. One end of the access transistor may be connected to a bit line BL or a complementary bit line BLB arranged in the column direction. The other end of the access transistor may be connected to the cell capacitor.

The bank/row decoder 124b may select a word line of a memory cell to be accessed, in response to an address ADD from the address buffer 1241. The row decoder 124b may decode the inputted address ADD and may enable a word line based on the decoded inputted address ADD. In addition, the row decoder 124b may decode a row address generated from an address counter (not illustrated) during a self-refresh operation mode, and thus may enable the word line using the decoded row address. The column decoder 124d may select a bit line of the memory cell where data is inputted or outputted.

The bit line sense amplifier 124c may write data at the selected memory cell through the selected bit line or may sense previously written data through the selected bit line. The bit line sense amplifier 124c may sense data stored in a memory cell through a bit line and may transmit the sensed data to the multiplexer 124g. In addition, the bit line sense amplifier 124c may further include components for storing data inputted from the multiplexer 124g in the selected memory cell. Alternatively, during a self-refresh mode, the bit line sense amplifier 124c may read the data stored in the memory cell and may write the read data back in the memory cell.

The control logic 124e may control an internal operation of the dual-port DRAM 124 in response to a command CMD, a control signal CNTL, or an address. The control logic 124e may adjust, for example, the delay of a clock signal supplied from an outside or may decode an instruction with reference to control signals (i.e., /RAS and /CAS) and the address. In particular, the control logic 124e may select an operation mode with reference to the memory command/address MCA or information provided through the control signals. That is, the control logic 124e may determine whether a requested operation is a back-up/restore operation or a normal operation and may control the multiplexer 124 based on the determination result. To this end, the control logic 124e may include a mode register set MRS.

The address buffer 124f may temporarily store the address inputted from the outside. The address buffer 124f may supply the stored address to the bank/row decoder 124b or the column decoder 124d. An address of an external signaling manner may be converted by the address buffer 124f into an address of an internal signaling manner of the dual-port DRAM 124.

The multiplexer 124g may select one of the two input/output ports MDQ and LDQ in response to a mode selection signal M_SEL from the control logic 124e. During a normal operation where the dual-port DRAM 124 exchanges data with the host 110, the multiplexer 124g may select a first input/output port MDQ corresponding to the main channel. On the other hand, when the dual-port DRAM 124 operates in an operation mode for back-up or restoration, the multiplexer 124g may select a second input/output port LDQ corresponding to a back-up channel.

A bandwidth of the second input/output port LDQ may be set to be different from that of the first input/output port MDQ for exchanging data with the host 110. The bandwidth of the second input/output port LDQ may be designed according to a time taken to perform a back-up operation or the performance of an auxiliary power device for the back-up operation. For example, a bandwidth or a data transfer rate (or data rate) of the second input/output port LDQ may be lower than that of the first input/output port MDQ. Here, the number of pins (Xm) (e.g., m=4) of the first input/output port MDQ may be the same as that of the second input/output port LDQ. However, the scope and spirit of the disclosure may not be limited thereto. For example, the number of pins of the first input/output port MDQ may be different from that of the second input/output port LDQ.

Figure 5:
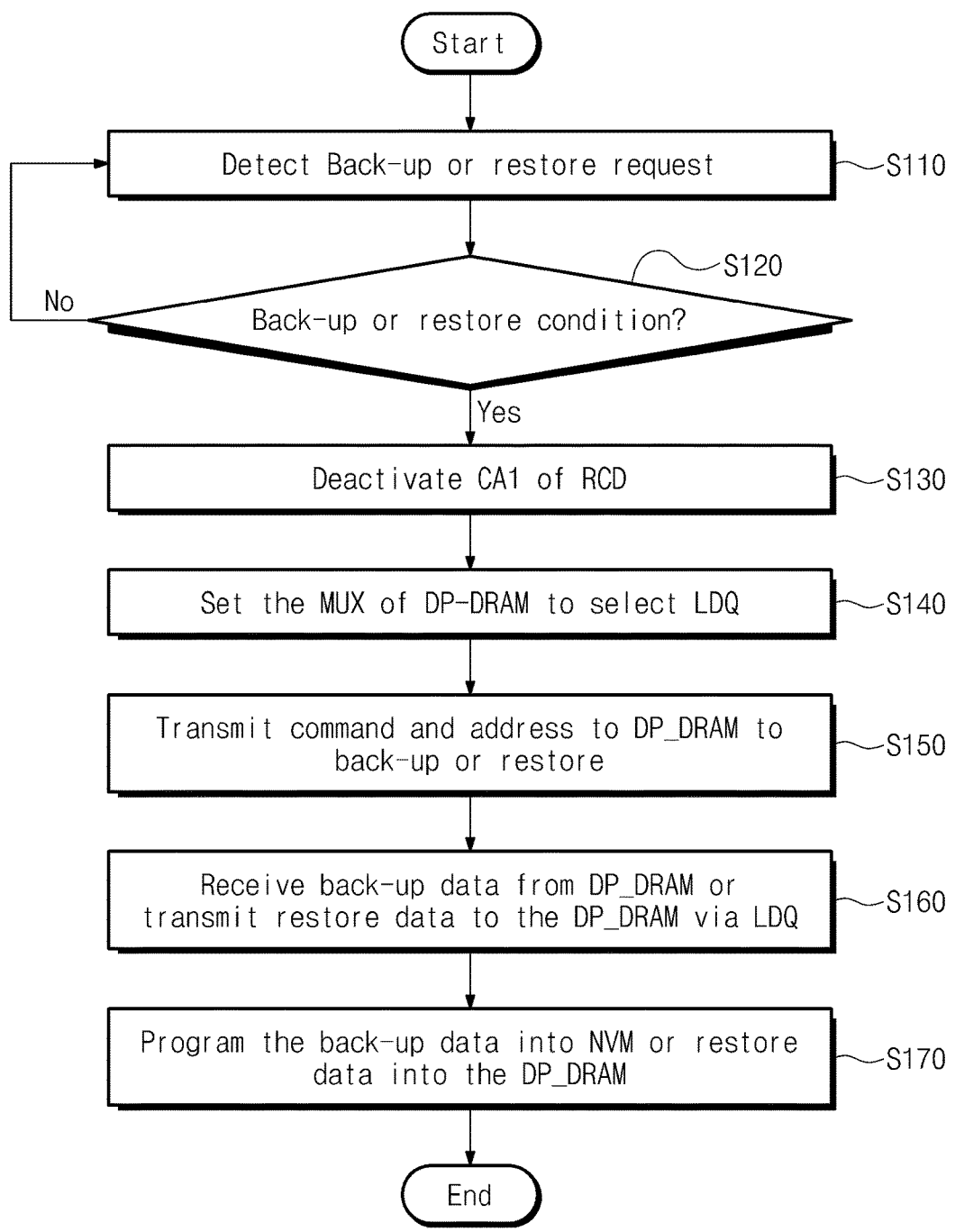
FIG. 5 is a flow chart illustrating a method for performing a back-up/restore operation of the NVM controller of FIG. 1 or 2.

FIG. 5 is a flow chart illustrating a method for performing a back-up/restore operation of the NVM controller 126 of FIG. 1 or 2. Referring to FIG. 5, the NVM controller 126 may control an input/output port of the RCD 122 or the dual-port DRAM 124 using a dual-port manner in response to a back-up/restore request.

In step S110, the NVM controller 126 may detect the need to back up data stored in the dual-port DRAM 124 or to restore data backed up in the nonvolatile memory 128 to the dual-port DRAM 124. For example, the NVM controller 126 may start the back-up operation or the restore operation based on a command or a control signal provided from the host 110 or a variety of information. Alternatively, the NVM controller 126 may monitor a status of a power provided to the nonvolatile memory module 120 and detect a back-up request based on the monitored status.

In step S120, the NVM controller 126 may determine whether a back-up/restore condition is satisfied, and an operation branch may occur based on the determination result. If the back-up/restore condition is determined as being satisfied (Yes), the procedure may proceed to step S130. In contrast, if the back-up/restore condition is not satisfied, the procedure may proceed to step S110.

In step S130, the NVM controller 126 may control ports of the RCD 122 such that the command/address CA2 for a back-up/restore operation is provided to the dual-port DRAM 124. That is, the NVM controller 126 may set the RCD 124 so as to block the command/address CA1 provided from the host 110 and so as to transmit the command/address CA2, provided from the NVM controller 126, as the memory command/address MCA.

In step S140, the NVM controller 126 may select the input/output port of the dual-port DRAM 124 using the command/address CA2 or a control signal. That is, the NVM controller 126 may activate the second input/output port LDQ connected to the back-up channel of the dual-port DRAM 124 and may deactivate the first input/output port MDQ connected to the main channel thereof.

In step S150, the NVM controller 126 may transmit the command/address CA2 for the back-up/restore operation to the dual-port DRAM 124. The NVM controller 126 may transmit a command/address CA2 such that only a portion of data loaded onto the dual-port DRAM 124 is selectively backed up. Alternatively, the NVM controller 126 may provide a command/address CA2 for backing-up all data loaded onto the DRAM 124 in the nonvolatile memory 128.

In step S160, the NVM controller 126 may receive back-up data outputted from the dual-port DRAM 124 through the second input/output port LDQ. Moreover, the NVM controller 126 may transmit restore data provided from the nonvolatile memory 128 to the second input/output port LDQ via the back-up channel. In this case, the back-up data may be outputted by a page or sequentially. However, it may be understood that the transfer size of back-up data is not limited thereto. For example, the size of the back-up data transmitted to the NVM controller 126 from the dual-port DRAM 124 may be smaller or greater than the size of one page. During a restore operation, when the restore data is written at the dual-port DRAM 124, an overall procedure about the restore operation may be terminated.

In step S170, the NVM controller 126 may program the back-up data provided from the dual-port DRAM 124 at the nonvolatile memory 128.

A control operation of the NVM controller 126 for the back-up/restore operation has been briefly described with reference to FIG. 5. In this case, a transmission bandwidth of the second input/output port LDQ of the dual-port DRAM 124 activated during a back-up/restore operation may be set to be different from that of the first input/output port MDQ. The reason is that no issue occurs if a transmission bandwidth for back-up data transferred between the dual-port DRAM 124 and the NVM controller 126 is greater than or equal to a transmission bandwidth for data transferred between the NVM controller 126 and the nonvolatile memory 128.

Figure 6:
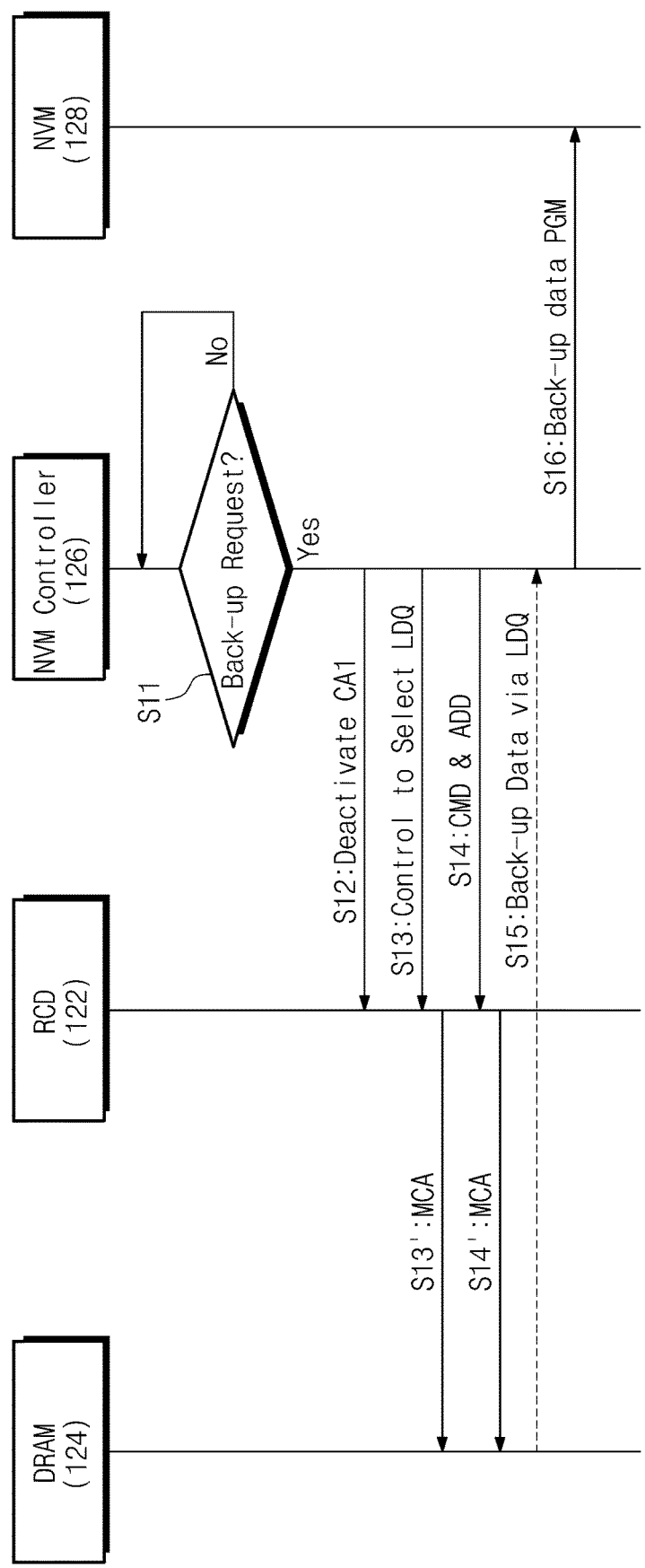
FIG. 6 is a diagram illustrating a back-up operation of a nonvolatile memory module according to an embodiment of the disclosure.

FIG. 6 is a diagram illustrating a back-up operation of a nonvolatile memory module according to an embodiment of the disclosure. Referring to FIG. 6, after setting a port of the dual LCD 122, the NVM controller 126 may select an input/output port of the dual-port DRAM 124.

In S11, the NVM controller 126 may determine whether a back-up operation is required. For example, in some cases, the host 110 may request the nonvolatile memory module 120 to perform a back-up operation through a control signal SAVE_n, a command, or the like of the host. Alternatively, the NVM controller 126 may monitor a status of a power supply voltage and may determine whether the back-up operation is required, based on the monitoring result. If the back-up operation is determined as not being required, the NVM controller 126 may continue to monitor the need to perform the back-up operation. On the other hand, if the back-up operation is determined as being required, the NVM controller 126 needs to set a port of the RCD 122.

In S12, the NVM controller 126 may control the port of the RCD 122 such that the command/address CA2 for a back-up/restore operation is provided to the dual-port DRAM 124. For example, the NVM controller 126 may set the RCD 124 so as to block the command/address CA1 provided from the host 110 and so as to transmit the command/address CA2, provided from the NVM controller 126, as the memory command/address MCA.

In S13, the NVM controller 126 may select input/output ports of the dual-port DRAM 124 using the command/address CA2 or a control signal. For example, the NVM controller 126 may activate the second input/output port LDQ connected to the back-up channel of the dual-port DRAM 124 and may deactivate the first input/output port MDQ connected to the main channel thereof. With such setting illustrated in S13', the memory command/address MCA provided to the dual-port DRAM 124 may be used via the RCD 122.

In S14, the NVM controller 126 may transmit the command/address CA2 for a back-up/restore operation to the dual-port DRAM 124. As illustrated in S14', the command/address CA2 may be transmitted as the memory command/address MCA provided to the dual-port DRAM 124 via the RCD 122.

In S15, the dual-port DRAM 124 may sense the back-up data and may output the sensed back-up data to the second input/output port LDQ. In this case, the back-up data may be transmitted to the NVM controller 126 via the back-up channel (e.g., LDQ). In S16, the NVM controller 126 may program the back-up data at the nonvolatile memory 128.

Figure 7:
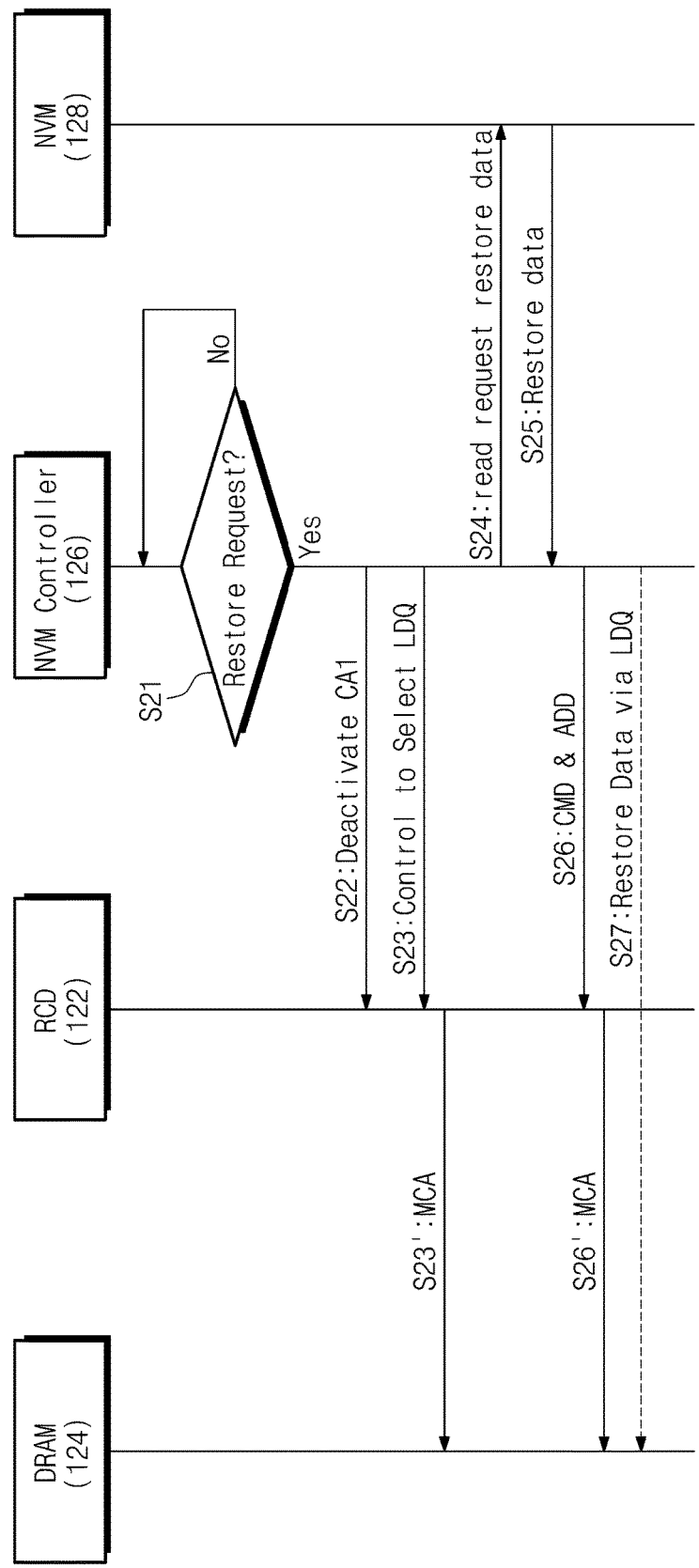
FIG. 7 is a diagram illustrating a restore operation of a nonvolatile memory module according to an embodiment of the disclosure.

FIG. 7 is a diagram illustrating a restore operation of a nonvolatile memory module according to an embodiment of the disclosure. Referring to FIG. 7, after setting a port of the RCD 122, the NVM controller 126 may select to connect an input/output port of the dual-port DRAM 124 to a channel for a restore operation.

In S21, the NVM controller 126 may detect whether to restore data stored in the nonvolatile memory 128 to the dual-port DRAM 124. For example, during a boot or reset operation after a power error, a restore operation of the nonvolatile memory module 120 may be started through a restore command of the host 110 (refer to FIG. 1). If the back-up operation is determined as not being required, the NVM controller 126 may continue to monitor the necessity of the back-up operation. On the other hand, if the back-up operation is determined as being required, the NVM controller 126 may have to set ports of the RCD 122.

In S22, the NVM controller 126 may control ports of the RCD such that the command/address CA2 for a back-up/restore operation is provided to the dual-port DRAM 124. For example, the NVM controller 126 may set the RCD 124 so as to block the command/address CA1 provided from the host 110 and so as to transmit the command/address CA2, provided from the NVM controller 126, as the memory command/address MCA.

In S23, the NVM controller 126 may select input/output ports of the dual-port DRAM 124 using the command/address CA2 or a control signal. For example, the NVM controller 126 may activate the second input/output port LDQ connected to the back-up channel of the dual-port DRAM 124 and may deactivate the first input/output port MDQ connected to the main channel thereof. As such setting described in S23', the memory command/address MCA provided to the dual-port DRAM 124 may be used via the RCD 122.

In S24, the NVM controller 126 may request the restore data from the nonvolatile memory 128. In S25, the NVM controller may receive the restore data read from the nonvolatile memory 128.

In S26, the NVM controller 126 may transmit a command/address CA2 for writing the recovered data to the dual-port DRAM 124. As described in S26', the command/address CA2 may be transmitted using the memory command/address MCA provided to the dual-port DRAM 124 via the RCD 122. In S27, the NVM controller 126 may transmit the restore data through the activated back-up channel. In this case, the restore data may be written at an assigned position of the dual-port DRAM 124 through the second input/output port LDQ.

During a restore operation, mutual operations between the RCD 122, the dual-port DRAM 124, the NVM controller 126, and the nonvolatile memory 128 are briefly described. However, back-up data transmitted from the dual-port DRAM 124 during a back-up operation may include parity for error correction or CRC for data integrity.

Figure 8:
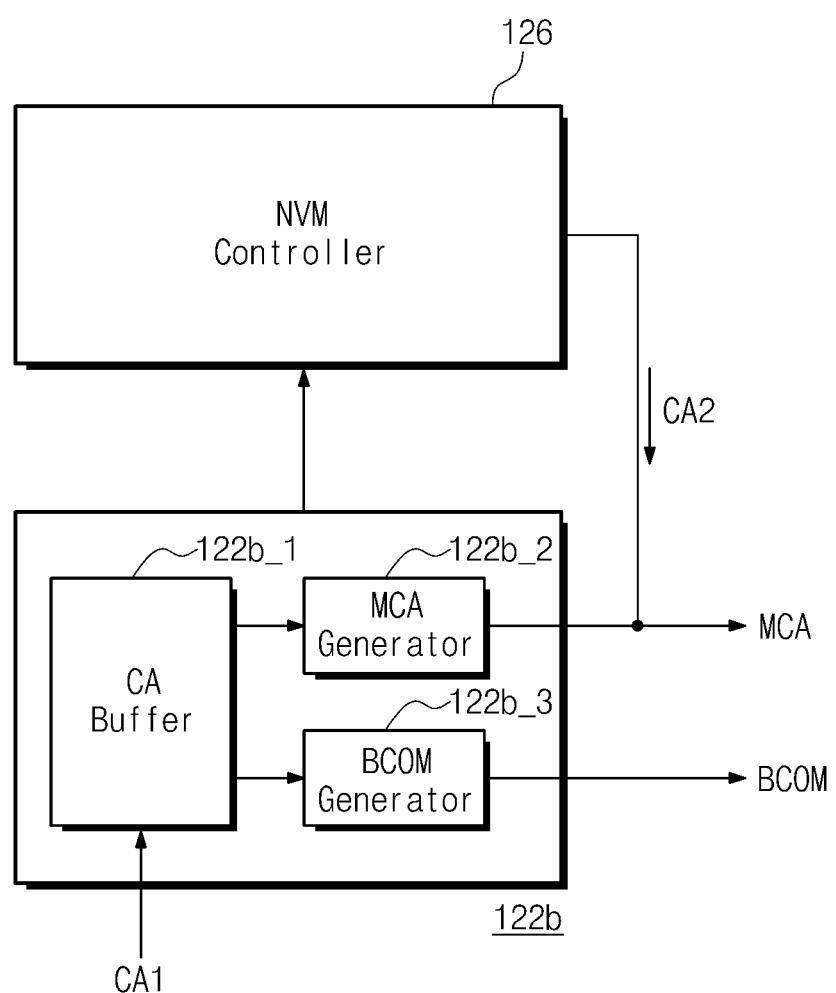
FIG. 8 is a block diagram illustrating another structure of the RCD of FIG. 2.

FIG. 8 is a block diagram illustrating another structure of the RCD described in FIG. 2. Referring to FIG. 8, the RCD 122*b* may include a CA buffer 122*b*_1, an MCA generator 122*b*_2, and a buffer command generator 122*b*_3.

The CA buffer 122*b*_1 may buffer the command/address CA1 and may transmit the buffered command/address CA1 to the MCA generator 122*b*_2. In this case, the CA buffer 122*b*_1 may not receive the command/address CA2 provided from NVM controller 126. In addition, the CA buffer

122b_1 may control the BCOM generator 122b_3 based on the buffered command/address CA1.

The MCA generator 122b_2 may generate the memory command/address MCA corresponding to the command/address CA1 provided from the CA buffer 122b_1. When the dual-port DRAM 124 is provided in plural, the MCA generator 122b_2 may transmit the generated memory command/address MCA to each of a plurality of dual-port DRAMs 124. However, an output port of the MCA generator 122b_2 may be connected to an output port of the command/address CA2 using a wired couple manner. When the command/address CA2 of the NVM controller 126 is activated, an output of the MCA generator 122b_2 may be changed to a high-impedance (Hi-Z) state. Thus, when the command/address CA2 of the NVM controller 126 for a back-up/restore operation is provided, the command/address CA2 of the NVM controller 126 may be transmitted to the dual-port DRAM 124 as the memory command/address MCA.

An operation of the BCOM generator 122b_3 may be substantially the same as that described with reference to FIG. 3, and a detailed description thereof is thus omitted.

The RCD 122b described above may generate the memory command/address MCA based on the command/address CA1 provided from the host 110. In addition, the RCD 122b may control the NVM controller 126 based on the command/address CA1 provided from the host 110. Meanwhile, the command/address CA2 of the NVM controller 126 may be provided to the dual-port DRAM 124 using the wired couple manner.

Figure 9:
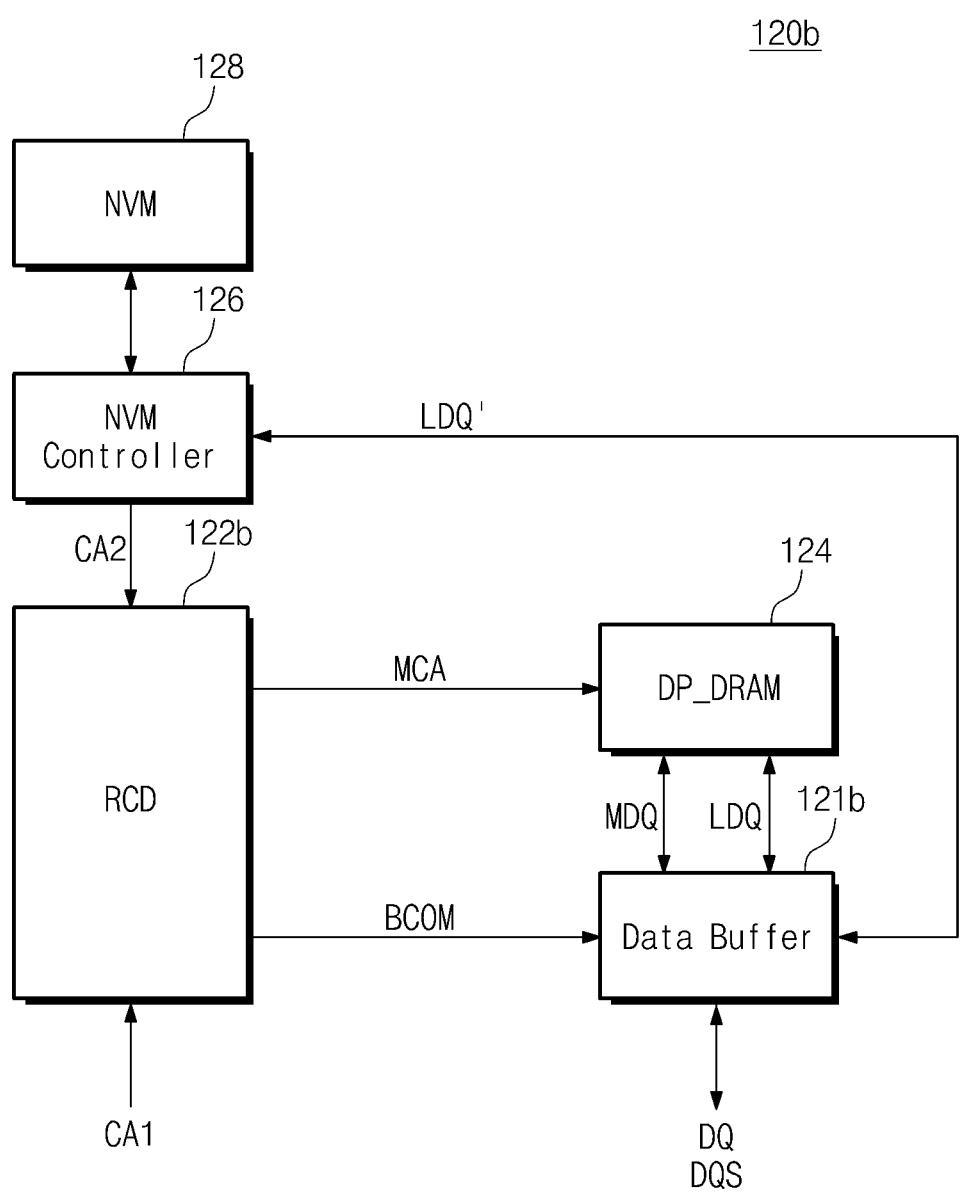
FIG. 9 is a block diagram illustrating another embodiment of the nonvolatile memory module illustrated in FIG. 1.

FIG. 9 is a block diagram illustrating another embodiment of the nonvolatile memory module illustrated in FIG. 1. Referring to FIG. 9, a nonvolatile memory module 120b may include a data buffer 121b, the dual-port DRAM 124, the NVM controller 126, the RCS 122b, and the nonvolatile memory 128.

The data buffer 121b may receive data from the host 110 through the data signal DQ and the data strobe signal DQS and may transmit the received data to the dual-port DRAM 124. Alternatively, the data buffer 121b may receive data outputted from the first input/output port MDQ of the dual-port DRAM 124 and may transmit the received data to the host 110 through the data signal DQ and the data strobe signal DQS.

In particular, during a back-up/restore operation, the data buffer 121b may exchange data with the second input/output port LDQ of the dual-port DRAM 124. During a back-up operation, the data buffer 121b may transmit back-up data outputted to the second output port LDQ of the dual-port DRAM 124 via the back-up channel LDQ' of the NVM controller 126. During a restore operation, restore data may be provided to the dual-port DRAM 124 in an opposite direction of the back-up operation. Thus, the data buffer 121b may connect one of the host 110 and the NVM controller 126 to the dual-port DRAM 124 based on an operation mode.

The RCD 122b may receive the command/address CA1 or a control signal CTRL provided from the host 110 (not illustrated), and thus may transmit the received command/address or control signal CA1 or CTRL as a memory command/address MCA to the dual-port DRAM 124. The dual-port DRAM 124 may exchange data with the host 110 in response to the memory command/address MCA provided by the RCD 122b. The RCD 122b may provide a command BCOM for controlling the data buffer 121b. The RCD 122b may receive the command/address CA2 provided from the NVM controller 126, or the control signal CTRL and may transmit the received command/address CA2 as the memory command/address MCA to the dual-port DRAM 124. In particular, the RCD 122b may provide the buffer command BCOM so as to select a data path between one of the host 1110 and the NVM controller 126 and the dual-port DRAM 124 in response to the command/address CA2 provided by the NVM controller 126 or the control signal CTRL.

Functions or operations of the dual-port DRAM 124, the NVM controller 126, and the nonvolatile memory 128 may be substantially the same as those described with reference to FIG. 3, and a detailed description thereof is thus omitted.

According to the above-described nonvolatile memory module 120b, the dual-port DRAM 124 may include the main channel for exchanging data with the host 110 and the back-up channel for back-up. In addition, the nonvolatile memory module 120b may operate as a DRAM module during a normal operation; when power is removed or a power error occurs, the nonvolatile memory module 120 may back-up data being used in the nonvolatile memory 128. Thus, the nonvolatile memory module 120 may operate as a DRAM module accessible in high speed, and the nonvolatile memory module 120 may have the nonvolatile characteristic which retains data being driven even when power is removed.

Figure 10:
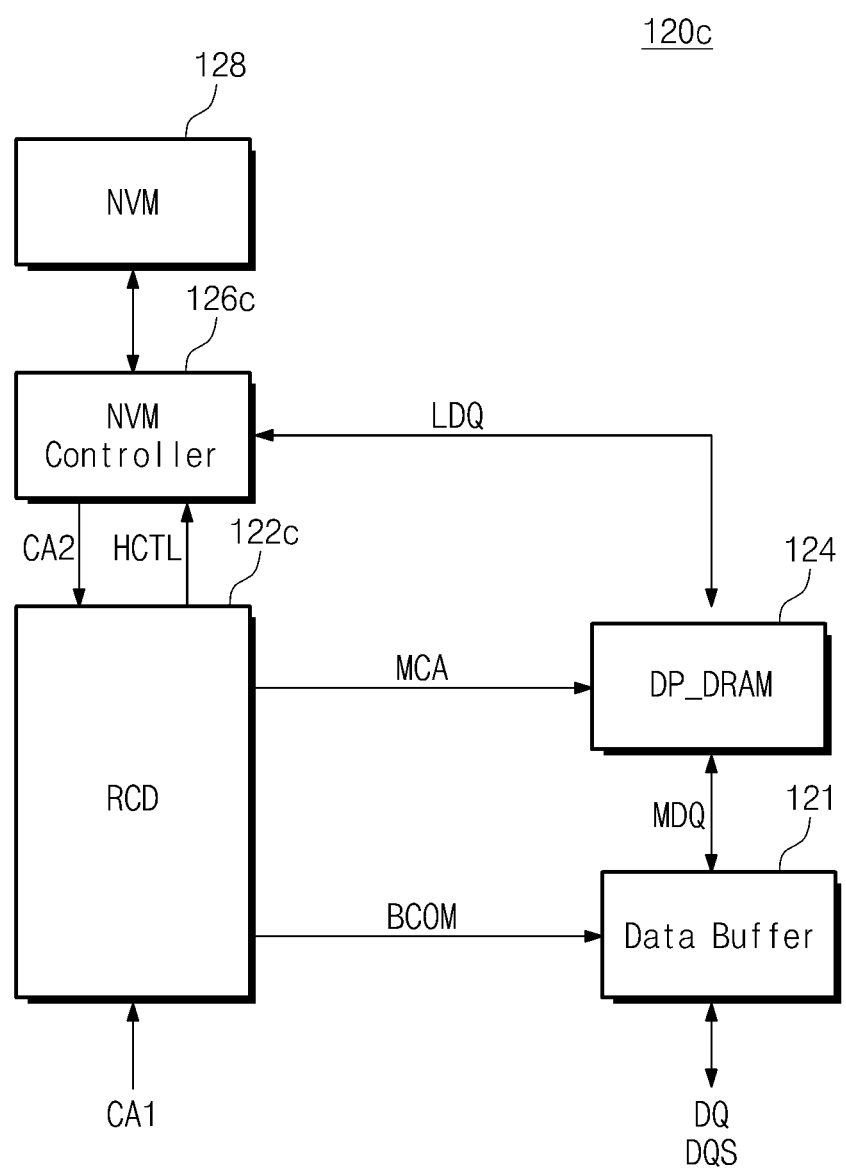
FIG. 10 is a block diagram illustrating another embodiment of the nonvolatile memory module illustrated in FIG. 1.

FIG. 10 is a block diagram illustrating another embodiment of the nonvolatile memory module illustrated in FIG. 1. Referring to FIG. 10, a nonvolatile memory module 120c may include the data buffer 121, the dual-port DRAM 124, a NVM controller 126c, and the nonvolatile memory 128.

The data buffer 121 may receive data from the host 110 through the data signal DQ and the data strobe signal DQS and may transmit the received data to the first output port MDQ of the dual-port DRAM 124. Alternatively, the data buffer 121 may receive data outputted from the first output port MDQ of the dual-port DRAM 124 and may transmit the received data to the host 110 through the data signal DQ and the data strobe signal DQS. In this embodiment, the data buffer 121 may be used to exchange data with the host 110.

The RCD 122c may receive the command/address CA1 or a control signal CTRL provided from the host 110 (not illustrated), and thus may transmit the received command/address or control signal CA1 or CTRL as the memory command/address MCA to the dual-port DRAM 124. The dual-port DRAM 124 may exchange data with the host 110 in response to the memory command/address MCA provided from the RCD 122c. The RCD 122c may provide a command BCOM for controlling the data buffers 121. The RCD 122c may receive the command/address CA2 provided from the NVM controller 126, or the control signal CTRL and may transmit the received CA2 as the memory command/address MCA to the dual-port DRAM 124. In particular, the RCD 122c may provide the command/address CA1 or the control signal provided from the host 110 to a NVM controller 126c as a host control signal HCTL.

The NVM controller 126c may perform a back-up/restore operation in response to the host control signal HCTL based on a command of the host 110. The NVM controller 126c may generate the command/address CA2 for performing the back-up/restore operation under the control of the host and may transmit the generated command/address CA2 to the RCD 122c.

Functions and structures of the dual-port DRAM 124, the NVM controller 126, and the nonvolatile memory 128 may be substantially the same as those described with reference to FIG. 14, and a description thereof is thus omitted.

Figure 11:
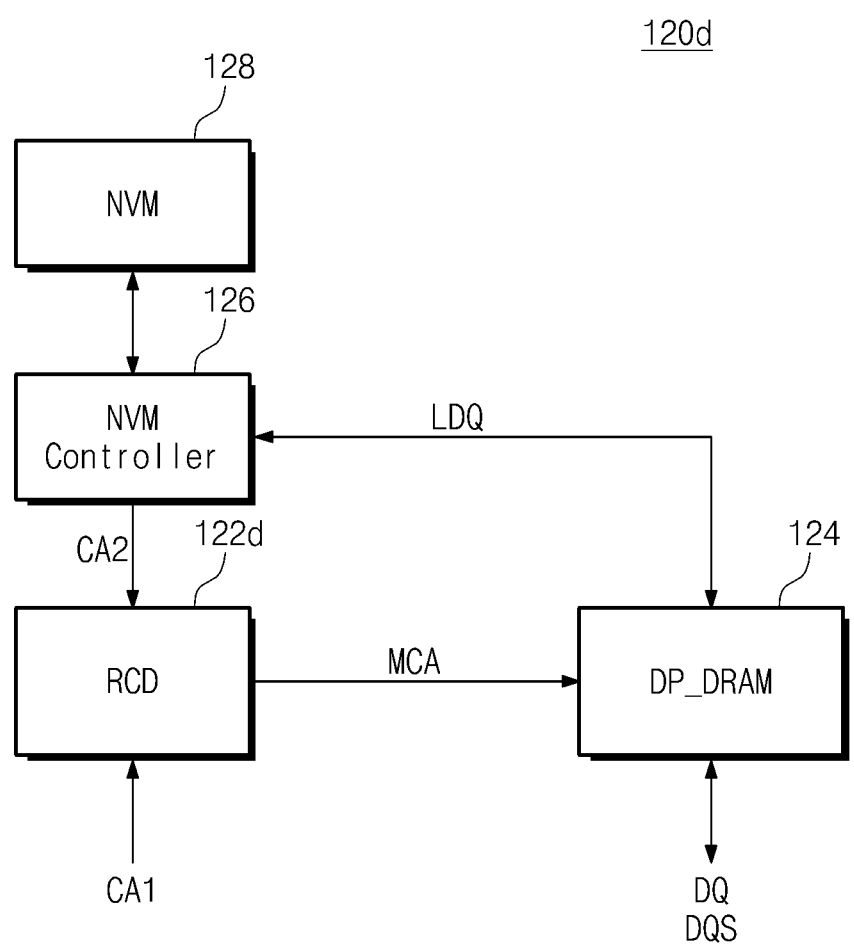
FIG. 11 is a block diagram illustrating another embodiment of the nonvolatile memory module illustrated in FIG. 1.

FIG. 11 is a block diagram illustrating another embodiment of the nonvolatile memory module illustrated in FIG.

1. Referring to FIG. 11, a nonvolatile memory module 120d may include an RCD 122d, the dual-port DRAM 124, the NVM controller 126, and the nonvolatile memory 128. In particular, the nonvolatile memory module 120d may be implemented in the RDIMM type which does not include a data buffer.

The RCD 122d may transmit one, as the memory command/address MCA, from among the command/address CA1 from the host 110 (refer to FIG. 1) or the command/address CA2 from the NVM controller 126 to the dual-port DRAM 124. However, the RCD 122d may not be required to generate the buffer command BCOM provided to the data buffer. Therefore, compared with the RCD 122a of FIG. 3, the RCD 122a may be provided in a relatively simple structure.

Functions and structures of the dual-port DRAM 124, the NVM controller 126, and the nonvolatile memory 128 may be substantially the same as those described with reference to FIG. 2, and a detailed description thereof is thus omitted.

Figure 12:
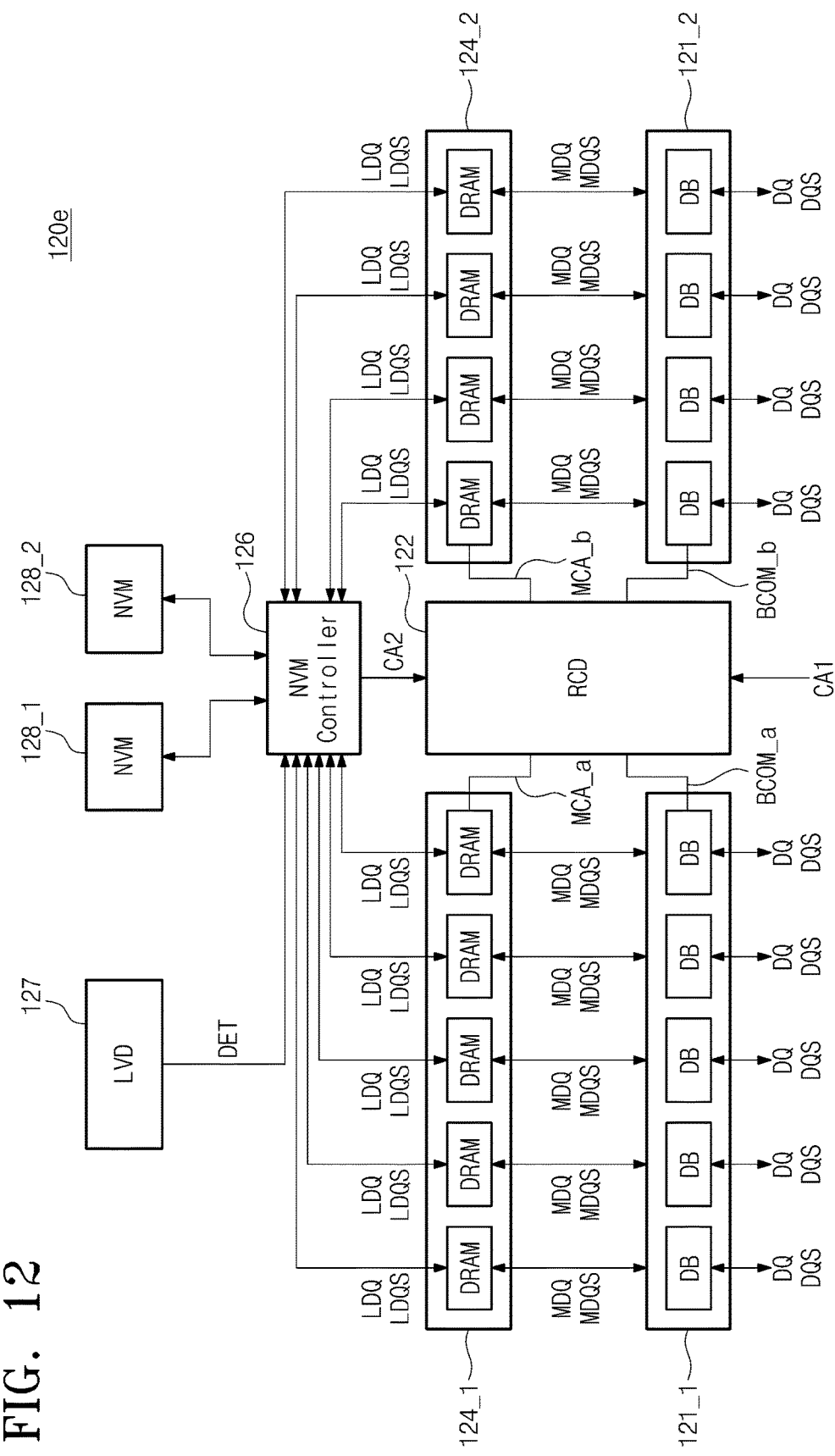
FIG. 12 is a block diagram illustrating an example embodiment in which the nonvolatile memory module of FIG. 1 is configured in the form of a dual in-line memory module (DIMM)

FIG. 12 is a block diagram illustrating an example embodiment in which the nonvolatile memory module of FIG. 1 is configured in the form of a dual in-line memory module (DIMM). Referring to FIG. 12, a nonvolatile memory module 120e may include an RCD 122, a plurality of dual-port DRAMs 124_1 to 124_2, the NVM controller 126, and nonvolatile memories 128_1 and 128_2. Furthermore, the nonvolatile memory module 120e may further include data buffers 121_1, and 121_2 placed between the dual-port DRAMs 124_1 and 124_2 and the host 110, and a low-voltage detector 127 for detecting a power voltage state of the nonvolatile memory module 120e. Moreover, although not shown, it may be understood that the nonvolatile memory module 120e further includes an auxiliary power source 127 for back-up.

The data buffers 121_1 and 121_2 may receive the data signal DQ and the data strobe signal DQS from the host 110 and may transfer the received DQ and DQS to the dual-port DRAMs 124_1 and 124_2 as signals MDQ and MDQS. The data buffers 121_1 and 121_2 may allow the nonvolatile memory module 220a to have a structure which is compatible with a load reduced DIMM (LRDIMM).

The RCD 122 may have a dual-port structure which makes it possible to receive all of the command/address from the host 110 and the NVM controller 126. The RCD 122 may receive a command, an address, or the control signal CA1 provided from the host 110 and may transmit the received command, address, or control signal CA1 as memory command/addresses MCA_a and MCA_b to the dual-port DRAMs 124_1 and 124_2. In particular, the RCD 122 may generate commands BCOM_a and BCOM_b for controlling the data buffers 121_1 and 121_2. Buffer commands BCOM_a and BCOM_b may be generated based on one, which is selected by the RCD 122 based on an operation mode, from among the command/addresses CA1 and CA2. Alternatively, in the case that the data buffers 121_1 and 121_2 do not provide the back-up/restore channel, the buffer commands BCOM_a and BCOM_b may be generated by the command/address CA1 provided from the host 110.

A plurality of dual-port DRAMs 124_1 and 124_2 may include the same type of chips as the dual-port DRAM 124 of FIG. 4 described above. The dual-port DRAMs 124_1 and 124_2 may exchange data with the host 110 in response to the memory command/addresses MCA_a and MCA_b through the data buffers 121_1 and 121_2. For example, the dual-port DRAMs 124_1 and 124_2 may exchange data with the host 110 through first input/output ports MDQ and MDQS to configure the main channel. The dual-port DRAMs 124_1 and 124_2 may exchange data with the NVM controller 110 in response to the memory command/addresses MCA_a and MCA_b from the RCD 122. For example, the dual-port DRAMs 124_1 and 124_2 may exchange back-up data or restore data with the NVM controller 126 through second input/output ports LDQ and LDQS to configure the back-up channel.

The NVM controller 126 may execute a back-up/restore operation under control of the host 110 or through an automatic monitored result thereof. A command, a control signal or various means provided from the host 110 may be provided to the NVM controller 126 as information for requiring a back-up operation through the RCD 122 or directly. A level of a power supply voltage supplied to the nonvolatile memory module 120 may be detected through a low voltage detector 127 and whether a power error occurs may be monitored based on the detected voltage level. The detection result DET may be communicated to NVM controller 126. When the back-up operation is activated, the NVM controller 126 may activate at least one of second input/output ports LDQ and LDQS of the dual-port DRAMs 124_1 and 124_2, and thus may receive back-up data through the back-up channel. The NVM controller 126 may store data outputted from the dual-port DRAMs 124_1 and 124_2 in the nonvolatile memories 128_1 and 128_1.

As described above, according to the nonvolatile memory module 120e, the dual-port DRAMs 124_1 and 124_2 may use the first input/output ports MDQ and MDQS for exchanging data with the host 110. On the other hand, during a back-up/restore operation, the dual-port DRAMs 124_1 and 124_2 may activate the second input/output ports LDQ and LDQS to configure the back-up channel. A transmission bandwidth or an input/output speed of the first input/output ports MDQ and MDQS may be set to be different from that of the second input/output ports LDQ and LDQS based on the performance of the nonvolatile memory module 120e.

Figure 13:
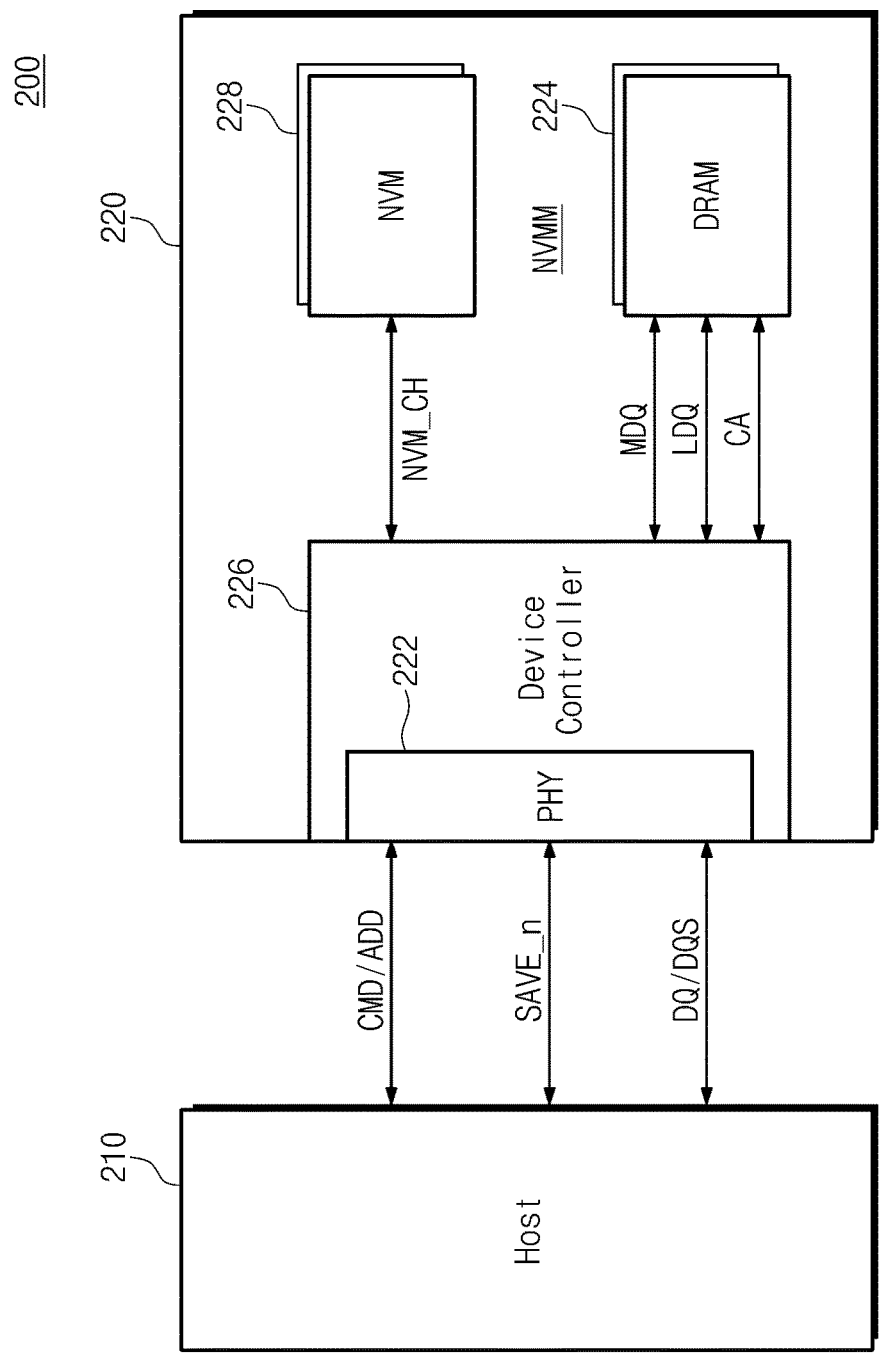
FIG. 13 is a block diagram illustrating a user device according to an embodiment of the disclosure.

FIG. 13 is a block diagram illustrating a user device 200 according to an embodiment of the disclosure. Referring to FIG. 13, a user device 200 may include a host 210 and a nonvolatile memory module 220. Here, the nonvolatile memory module 220 may be used as a storage of the user device 200, and a DRAM 224 may be used as a buffer memory of the storage. A function and operation of the host 210 may be substantially the same as that of FIG. 1, and an operation description thereof is thus omitted.

The nonvolatile memory module (NVMM) 220 may include a device controller 226, a DRAM 224, and a nonvolatile memory 228. The device controller 226 may include a physical layer 222 for low-level interfacing with the host 210. Through the physical layer 222, the host 210 may control such that data loaded onto the DRAM 224 is backed up in the nonvolatile memory 228, using a command or control signal (e.g., CMD/ADD). Alternatively, the device controller 226 may detect a power error or power loss (or interruption), and thus may control such that data of the DRAM 224 is backed up in the nonvolatile memory 228.

The DRAM 224 may have the same configuration and function as the dual-port DRAM 124 of FIG. 4 described above. During a back-up/restore operation, the DRAM 224 may activate the second input/output ports LDQ connected to the back-up channel. During a normal operation in which data exchange with the host 210 is performed, the DRAM 224 may activate the first input/output ports MDQ connected to the main channel.

When receiving a control signal SAVE_n or a command for performing a back-up operation from the host 210, the device controller 226 may activate an auxiliary power source for supporting the back-up operation. In addition, the device controller 226 may transmit the command/address CA to the DRAM with an auxiliary power supplied. Afterwards, the DRAM 224 may transmit the back-up data to the device controller 226, and the device controller 226 may thus program the back-up data at the nonvolatile memory 228 through a nonvolatile memory channel NVM_CH. During a restore operation, restore data may be transmitted to the DRAM 124 from the nonvolatile memory 228 in an opposite direction of the back-up operation.

Figure 14:
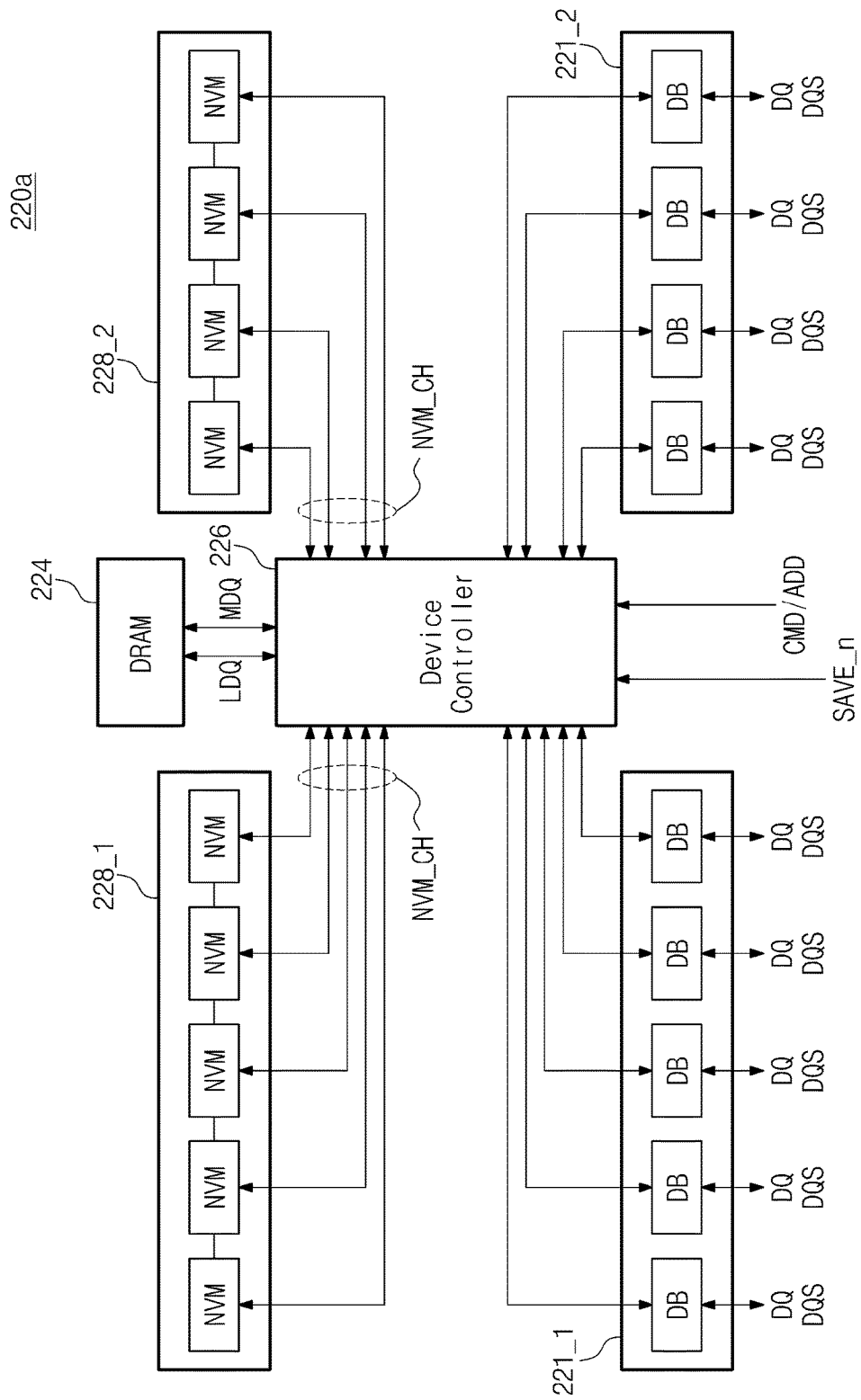
FIG. 14 is a block diagram illustrating a nonvolatile memory module illustrated in FIG. 13.

FIG. 14 is a block diagram illustrating a nonvolatile memory module illustrated in FIG. 13. Referring to FIG. 14, a nonvolatile memory module 220a may include data buffers 221_1 and 221_2, a DRAM 224, a device controller 226, and nonvolatile memories 228_1 and 228_2.

The data buffers 221_1 and 221_2 may receive the data signal DQ and the data strobe signal DQS from the host 210 and may transfer the received data signal DQ and data strobe signal DQS to the device controller 226. In the case that the data buffers 221_1, 221_2 exist, the nonvolatile memory module 220a may have, for example, a structure compatible with the load reduced DIMM (LRDIMM). In the case that the data buffers 221_1 and 221_2 do not exist, the nonvolatile memory module 220a may be provided in a structure compatible with the registered DIMM (RDIMM).

The device controller 226 may receive a control signal (e.g., SAVE_n) and the command/address (CMD/ADD) CA from the host 210. Furthermore, the device controller 226 may store data provided from the host 210 in the nonvolatile memories 228_1 and 228_2 using the DRAM 224 as a buffer. In contrast, the device controller 226 may transmit data stored in the nonvolatile memories 228_1 and 210_2 to the host 210 using the DRAM 224 as the buffer. Here, the DRAM 224 may select one of two input/output ports LDQ and MDQ based on an operation mode.

When moving data between the nonvolatile memories 228_1 and 228_2 and the host 110, the DRAM 224 may activate a first input/output port MDQ. On the other hand, during backing-up of data in the nonvolatile memories 228_1 and 228_2 or during an operation to restore the back-up data, the DRAM 224 may exchange the back-up data with the nonvolatile memories 228_1 and 228_2 using the second input/output port LDQ. Communication between nonvolatile memories 228_1 and 228_2 and device controller 226 may occur through a nonvolatile memory channel (NVM_CH).

Figure 15:
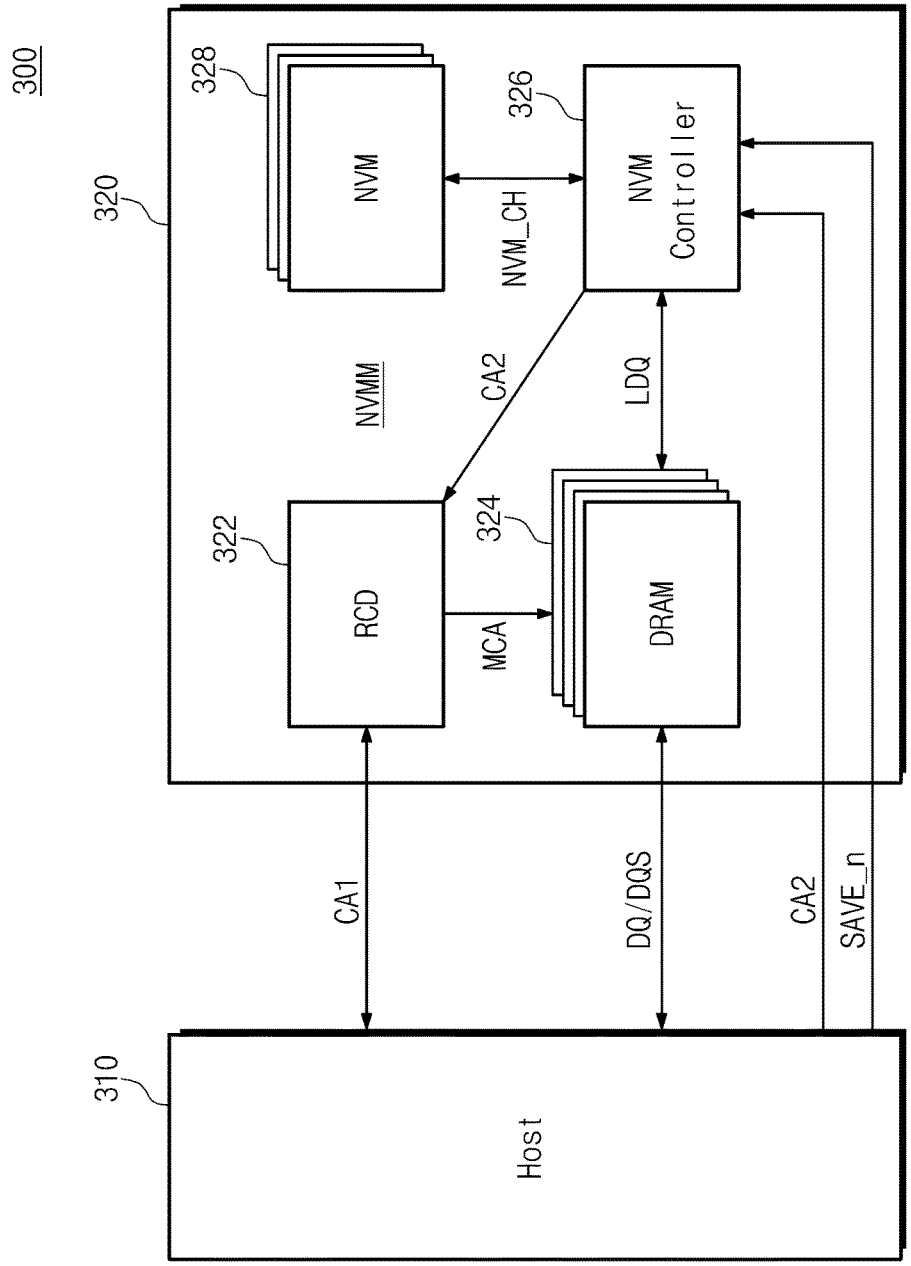
FIG. 15 is a block diagram illustrating a user device according to an embodiment of the disclosure.

FIG. 15 is a block diagram illustrating a user device 300 according to an embodiment of the disclosure. Referring to FIG. 15, a user device 300 may include a host 310 and a nonvolatile memory module 320. Here, the host 310 may recognize the nonvolatile memory module 320 as a DRAM module or as a nonvolatile storage.

The host 310 may recognize the nonvolatile memory module 320 as a DRAM module, and thus may use the nonvolatile memory module 320 as a main memory. That is, the host 310 may recognize the DRAM 324 and the nonvolatile memory 328 as ranks different from each other and may access them independently of each other. Alternatively, the host 310 may share the data signal DQ and the data strobe signal DQS of the nonvolatile memory module 320, but the host 310 may access one of the DRAM 324 and the nonvolatile memory 328 through a command/address CA1 or CA2. In addition, when a power error occurs, the host 310 may provide hint information about such situation to the nonvolatile memory module 320 through a command or a control signal. For example, such hint information may be provided to the nonvolatile memory module 320 using a control signal SAVE_n.

The nonvolatile memory module (NVMM) 320 may include an RCD 322, the DRAM 324, an NVM controller 326, and the nonvolatile memory 328. The RCD 322 may buffer the command/address CA1 provided from the host 310. The RCD 322 may transmit the buffered command/address CA1 as the memory command/address MCA to a plurality of DRAMs 324. The RCD 322 may receive the command/address CA2 from the NVM controller 326 and may transmit the received command/address CA2 as the memory command/address MCA to the DRAM 324.

As described above, the RCD 322 may buffer a control signal provided from the host 310 and may provide the buffered control signal to the DRAM 324. In an embodiment, the host 310 may transmit a control signal SAVE_n for back-up to the NVM controller 326.

The DRAM 324 may exchange data with the host 310 through the main channel and may exchange data with the NVM controller 326 through the back-up channel LDQ. The DRAM 324 may store data which is provided to a first input/output port (e.g., DQ/DQS) coupled to the main channel. Furthermore, the DRAM 324 may output data requested from the host 310 using the first input/output port. The DRAM 324 may include the back-up channel for communicating with the NVM controller 326, independently of the main channel. The back-up channel may be connected to the second input/output port LDQ of the DRAM 324. First and second input/output ports may be selected according to an operation mode.

The NVM controller 326 may be provided with a command/address CA2 of the host 310. Furthermore, the NVM controller 326 may exchange data with the host 310 using the data signal DQ and the data strobe signal DQS. In an embodiment, the NVM controller 326 may be set to be accessed by the host 310, independently of the RCD 322. Thus, the NVM controller 326 may perform a control operation such that the DRAM 324 and the nonvolatile memory 328 are recognized by the host 310 as ranks different to each other. In another operation mode, the NVM controller 326 may be used for back-up of the DRAM 324.

If receiving a control signal (e.g., SAVE_n) or a command for indicating a back-up start from the host 310, the NVM controller 326 may transmit the command/address CA2 to the RCD 322 and may activate the second input/output port LDQ of the DRAM 324. The NVM controller 326 may program the back-up data outputted from the DRAM 324 at the nonvolatile memory 328. During a restore operation, the second input/output port LDQ of the DRAM 324 may be activated in the same manner as the back-up operation which is only different from a transmission direction of the data.

Figure 16:
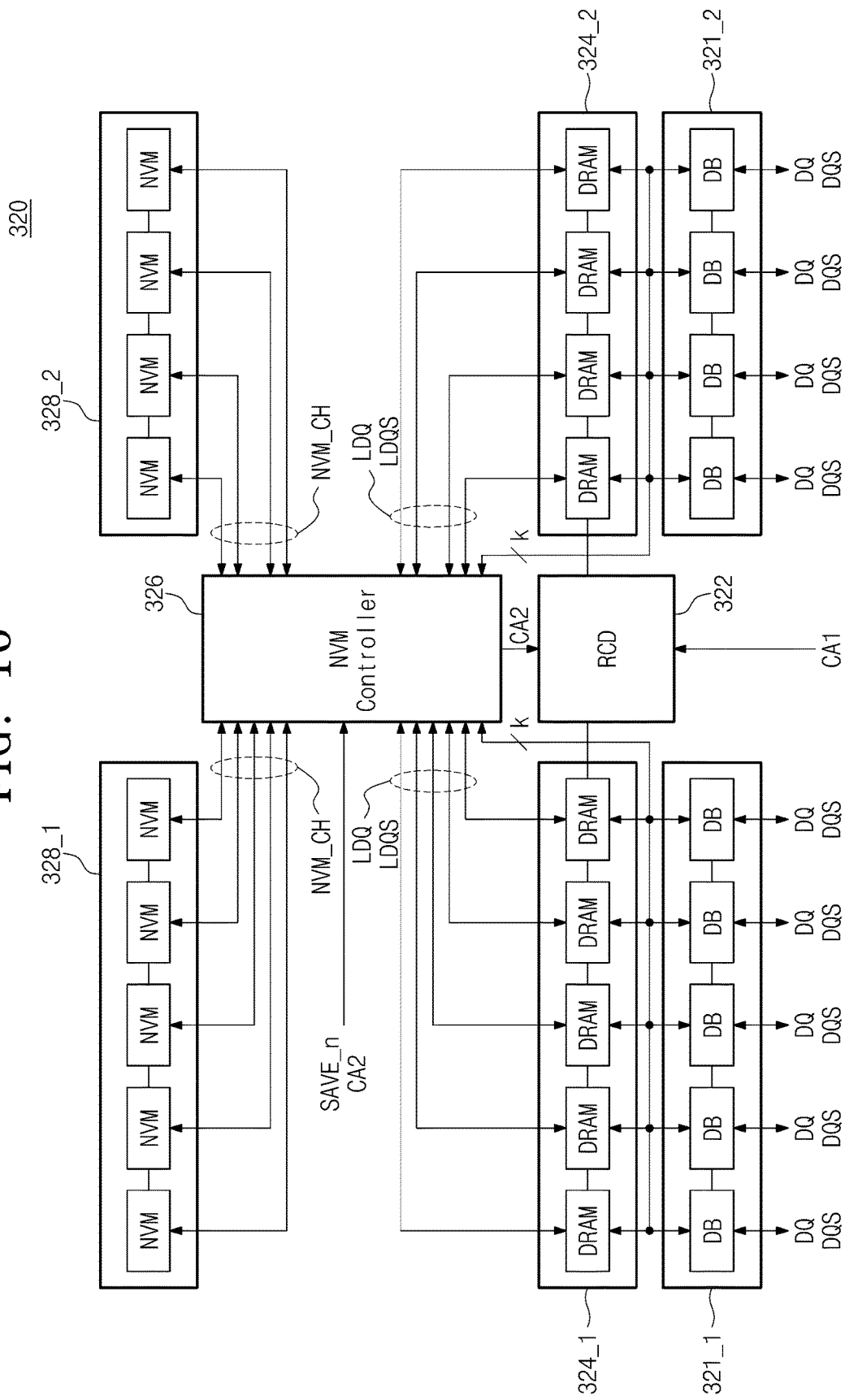
FIG. 16 is a block diagram illustrating the nonvolatile memory module illustrated in FIG. 15.

FIG. 16 is a block diagram illustrating the nonvolatile memory module illustrated in FIG. 15. Referring to FIG. 16, the nonvolatile memory module 320 may include data buffers 321_1 and 321_2, an RCD 322, DRAMs 324_1 to 324_2, the NVM controller 326, and nonvolatile memories 328_1 and 328_2. The data buffers 321_1 and 321_2, the DRAMs 324_1 to 324_2, the nonvolatile memories 328_1 and 328_2, and the like may be substantially the same as those described with reference to FIG. 1, and a detailed description thereof is thus omitted.

In a structure of the nonvolatile memory module 320, the host 310 may control the DRAMs 324_1 to 324_2 through the command/address CA1 provided to the RCD 322. The host 310 may exchange the data signal DQ and the data strobe signal DQS with the DRAMs 324_1 to 324_2 through the data buffers 321_1 and 321_2. In addition, the host 310 may directly access the nonvolatile memories 328_1 and 328_2 using the data signal DQ and the data strobe signal DQS transmitted through the command/address CA1 and the data buffers 321_1 and 321_2. That is, the host 310 may control the NVM controller 326 and may access the nonvolatile memories 328_1 and 328_2 based on the controlled result, independently of the DRAMs 324_1 and 324_2.

Furthermore, the NVM controller 326 according to an embodiment of the disclosure may perform the restore operation in response to a command or a control signal (e.g., SAVE_n) from the host 310, or based on an automatic determination operation of the NVM controller 326. During a back-up/restore operation, the NVM controller 326 may back-up data stored in the DRAMs 324_1 and 324_2 in the nonvolatile memories 328_1 and 328_1 using the back-up channel (e.g., LDQ/LDQS). That is, the NVM controller 326 may transmit the command/address CA2 to the RCD (322) for the back-up/restore operation. Each of the DRAMs 324_1 and 324_2 may activate a second input/output port LDQ for the back-up in response to a command/address (e.g., CA2) provided to the RCD 322. The back-up data corresponding to the command/address CA2 may be transmitted to the NVM controller 326 through the second input/output port LDQ. During a restore operation, the NVM controller 326 may control the DRAMs 324_1 and 324_2 in the same manner as the back-up operation which is only different from a transmission direction of the data through the RCD 322.

A transmission bandwidth of the back-up channel between the NVM controller 326 and the DRAMs 324_1 and 324_2 may be different from that of the main channel between the DRAMs 324_1 and 324_2 and the host 310. Here, the DRAMs 324_1 and 324_2 may be provided in the dual-port DRAM described in FIG. 4.

Figure 17:
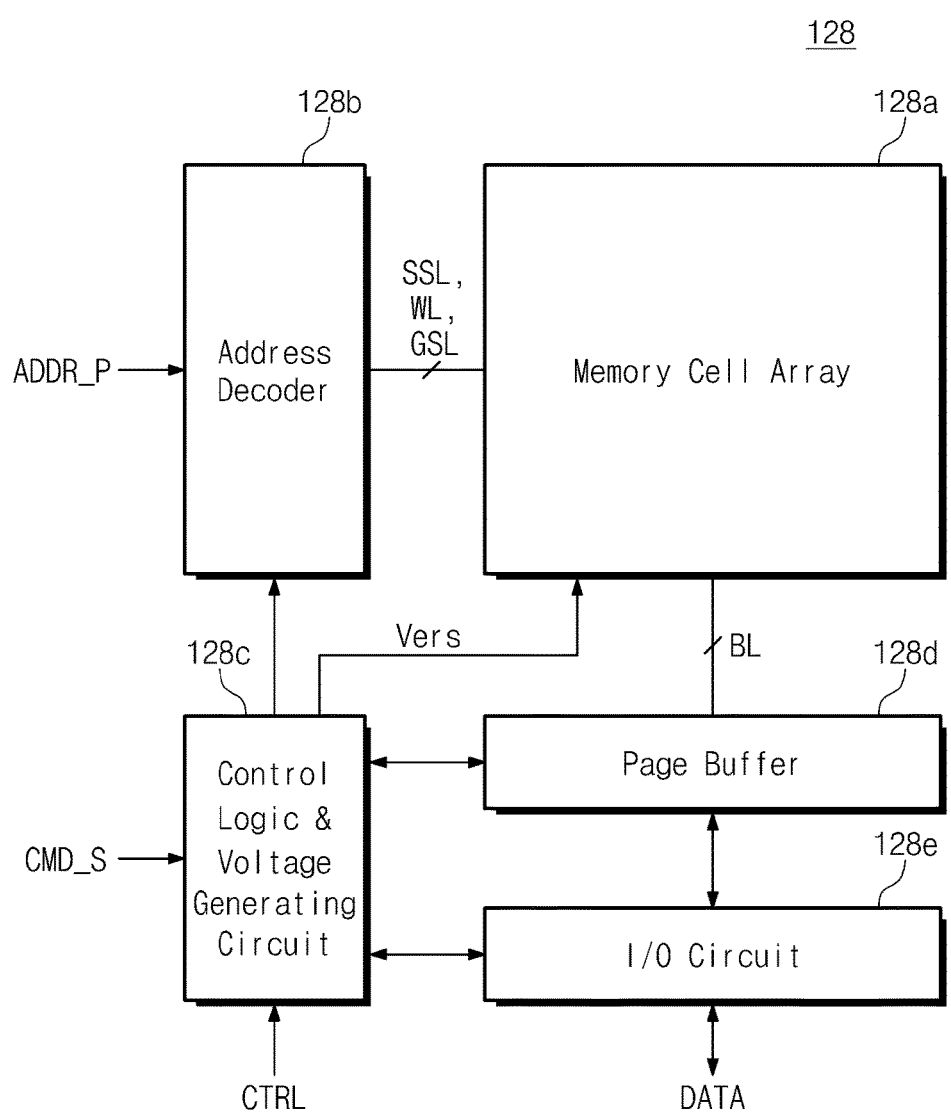
FIG. 17 is a block diagram illustrating an example embodiment of the nonvolatile memory described with reference to FIGS. 1, 2, and 9 to 16.

FIG. 17 is a block diagram illustrating an example embodiment of the nonvolatile memory described with reference to FIGS. 1, 2, and 9 to 16. In an example embodiment, the nonvolatile memory 128 of FIG. 1 will be described on behalf of the functions or characteristics of each of these nonvolatile memories. Referring to FIG. 17, a nonvolatile memory device 128 may include a memory cell array 128a, an address decoder 128b, control logic and voltage generator circuit 128c, a page buffer 128d, and an input/output circuit 128e.

The memory cell array 128a may include a plurality of memory blocks. Each of the memory blocks may include a plurality of cell strings. Each of the cell strings may include a plurality of memory cells. The memory cells may be connected with a plurality of word lines WL. Each of the memory cells may include a single level cell (SLC) storing one bit or a multi-level cell (MLC) storing at least two bits.

The address decoder 128b may be connected with the memory cell array 128a through the word lines WL, string selection lines SSL, and ground selection lines GSL. The address decoder 128b may receive a physical address ADDR_P from an external device (e.g., the device controller 110), may decode the received physical address ADDR_P and may drive the word lines based on the decoding result. For example, the address decoder 128b may decode a physical address ADDR_P received from the external device, may select at least one of the word lines based on the decoded physical address ADDR_P, and thus may drive the selected word line.

The control logic and voltage generator circuit 128c may receive a storage command CMD_S and a control signal CTRL from the external device and may control the address decoder 128b, the page buffer 128d, and the input/output circuit 128e in response to the received signals. For example, the control logic and voltage generator circuit 128c may control other components in response to the signals CMD_S and CTRL such that data is stored in the memory cell array 128a. Alternatively, the control logic and voltage generator circuit 128c may control other components in response to the signals CMD_S and CTRL such that data stored in the memory cell array 128a is transmitted to the external device.

The control logic and voltage generator circuit 128c may generate various voltages required for the nonvolatile memory device 128 to operate. For example, the control logic and voltage generator circuit 128c may generate various voltages Vers such as a plurality of program voltages, a plurality of pass voltages, a plurality of selection read voltages, a plurality of non-selection read voltages, a plurality of erase voltages, a plurality of verification voltages, and the like. The control logic and voltage generator circuit 128c may provide the generated voltages to the address decoder 128b or to a substrate of the memory cell array 128a.

The page buffer 128d may be connected to the memory cell array 128a through the bit lines BL. Under control of the control logic and voltage generator circuit 128c, the page buffer 128d may control the bit lines BL such that data provided from the input/output circuit 128e is stored in the memory cell array 128a. Under control of the control logic and voltage generator circuit 128c, the page buffer 128d may read data stored in the memory cell array 128a and may provide the read data to the input/output circuit 128e. In an example embodiment, the page buffer 128d may be provided with data from the input/output circuit 128e by the page or may read data from the memory cell array 128a by the page.

The input/output circuit 128e may receive data, DATA, from the external device and may transfer the received data to the page buffer 128d. Alternatively, the input/output circuit 128e may receive data from the page buffer 128d and may transmit the received data to the external device (e.g., the device controller 110). In an example embodiment, the input/output circuit 160 may exchange data with the external device in synchronization with the control signal CTRL.

Figure 18:
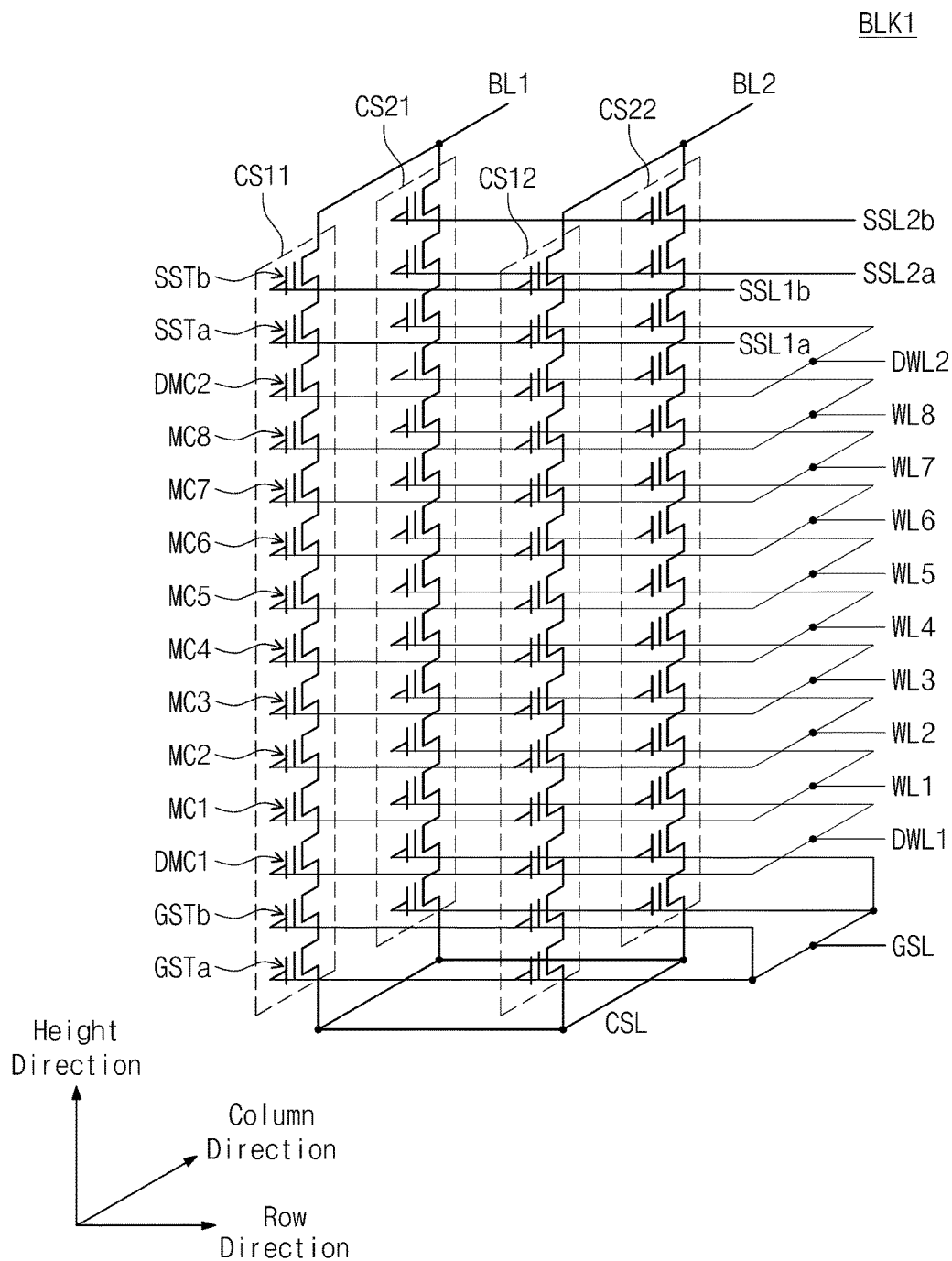
FIG. 18 is a circuit diagram illustrating an embodiment of a first memory block of memory blocks included in the memory cell array of FIG. 17.

FIG. 18 is a circuit diagram illustrating an embodiment of a first memory block of memory blocks included in the memory cell array of FIG. 17. In an example embodiment, a first memory block BLK1 of a 3-dimensional structure is described with reference to FIG. 18. However, the scope and spirit of the disclosure may not be limited thereto. Other memory blocks included in each nonvolatile memory 128 may have a structure which is similar to the first memory block BLK1.

Referring to FIG. 18, the first memory block BLK1 may include a plurality of cell strings CS11, CS12, CS21, and CS22. The cell strings CS11, CS12, CS21, and CS22 may be arranged along a row direction and a column direction to form rows and columns.

For example, the cell strings CS11 and CS12 may be connected to string selection lines SSL1a and SSL1b to form a first row. The cell strings CS21 and CS22 may be connected to string selection lines SSL2a and SSL2b to form a second row.

For example, the cell strings CS11 and CS21 may be connected to a first bit line BL1 to form a first column. The cell strings CS12 and CS22 may be connected to a second bit line BL2 to form a second column.

Each of the cell strings CS11, CS12, CS21, and CS22 may include a plurality of cell transistors. For example, each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2.

In an embodiment, each of a plurality of cell transistors included in the cell strings CS11, CS12, CS21, and CS22 may be a charge trap flash (CTF) memory cell.

A plurality of memory cells MC1 to MC8 may be serially connected and may be stacked in a height direction being a direction perpendicular to a plane defined by a row direction and a column direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL.

In an embodiment, a first dummy memory cell DMC1 may be disposed between the memory cells MC1 to MC8 and the ground selection transistors GSTa and GSTb. In an embodiment, a second dummy memory cell DMC2 may be disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL.

In an embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the first ground selection line, and the first ground selection transistors GSTa of the cell strings CS21 and CS22 in the second row may be connected to the second ground selection line.

In an example embodiment, although not shown, ground selection transistors provided in the same height from a substrate (not illustrated) may be connected to the same ground selection line, and ground selection transistors provided in different heights may be connected to different ground selection lines. For example, the first ground selection transistors GSTa of the cell strings CS11, CS12, CS21, and CS22 may be connected to the first ground selection line, and the second ground selection transistors GSTb may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, the first to eight memory cells MC1 to MC8 may be connected in common to the first to eighth word lines WL1 to WL8, respectively.

String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

Likewise, string selection transistors, belonging to the same row, from among the second string selection transistors SSTb at the same height may be connected to the same string selection line, and string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

Although not shown, string selection transistors of cell strings in the same row and different heights may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In an example embodiment, dummy memory cells at the same height may be connected with the same dummy word line, and dummy memory cells at different heights may be connected with different dummy word lines. For example, a first dummy memory cell DMC1 may be connected to the first dummy word line DWL1, and a second dummy memory cells DMC2 may be connected to the second dummy word line DWL2.

In the first memory block BLK1, read and write operations may be performed by the row. For example, one row of the memory block BLK1 may be selected by the string selection lines SSL1a, SSL1b, SSL2a, and SSL2b.

For example, the cell strings CS21 and CS22 in the first row may be connected to the bit lines BL1 and BL2 when the turn-on voltage is supplied to the string selection lines SSL1a and SSL1b and the turn-off voltage is supplied to the string selection lines SSL2a and SSL2b. The cell strings CS21 and CS22 in the second row may be connected to the bit lines BL1 and BL2 when the turn-on voltage is supplied to the string selection lines SSL2a and SSL2b and the turn-off voltage is supplied to the string selection lines SSL1a and SSL1b. Memory cells of the same height among the memory cells of the cell string in the row driven by driving the word line are selected. The read and write operations may be performed at the selected memory cells. The selected memory cells may be formed by a physical page.

In the first memory block BLK1, memory cells may be erased by the memory block or by the sub-block. When erasing is performed by the memory block, all memory cells MC in the first memory block BLK1 may be simultaneously erased according to an erase request (e.g., an erase request from an external memory controller). When erasing is performed by the sub-block, a portion of memory cells MC1 to MC8 in the first memory block BLK1 may be simultaneously erased according to an erase request (e.g., an erase request from an external memory controller), and the other portion thereof may be erase-inhibited. A low voltage (e.g., a ground voltage) may be supplied to a word line connected to memory cells MC to be erased, and a word line connected to erase-inhibited memory cells MC may be floated.

The first memory block BLK1 illustrated in FIG. 18 may be an example embodiment. For example, the number of cell strings may increase or decrease, and the number of rows of cell strings and the number of columns of cell strings may increase or decrease according to the number of cell strings. In addition, In the first memory block BLK1, the number of cell transistors (e.g., GST, MC, DMC, SST, or the like) may increase or decrease, and a height of the first memory block BLK1 may increase or decrease according to the number of cell transistors (e.g., GST, MC, DMC, SST, or the like). Furthermore, the number of lines (e.g., GSL, WL, DWL, SSL, or the like) connected with cell transistors may increase or decrease according to the number of the cell transistors.

Figure 19:
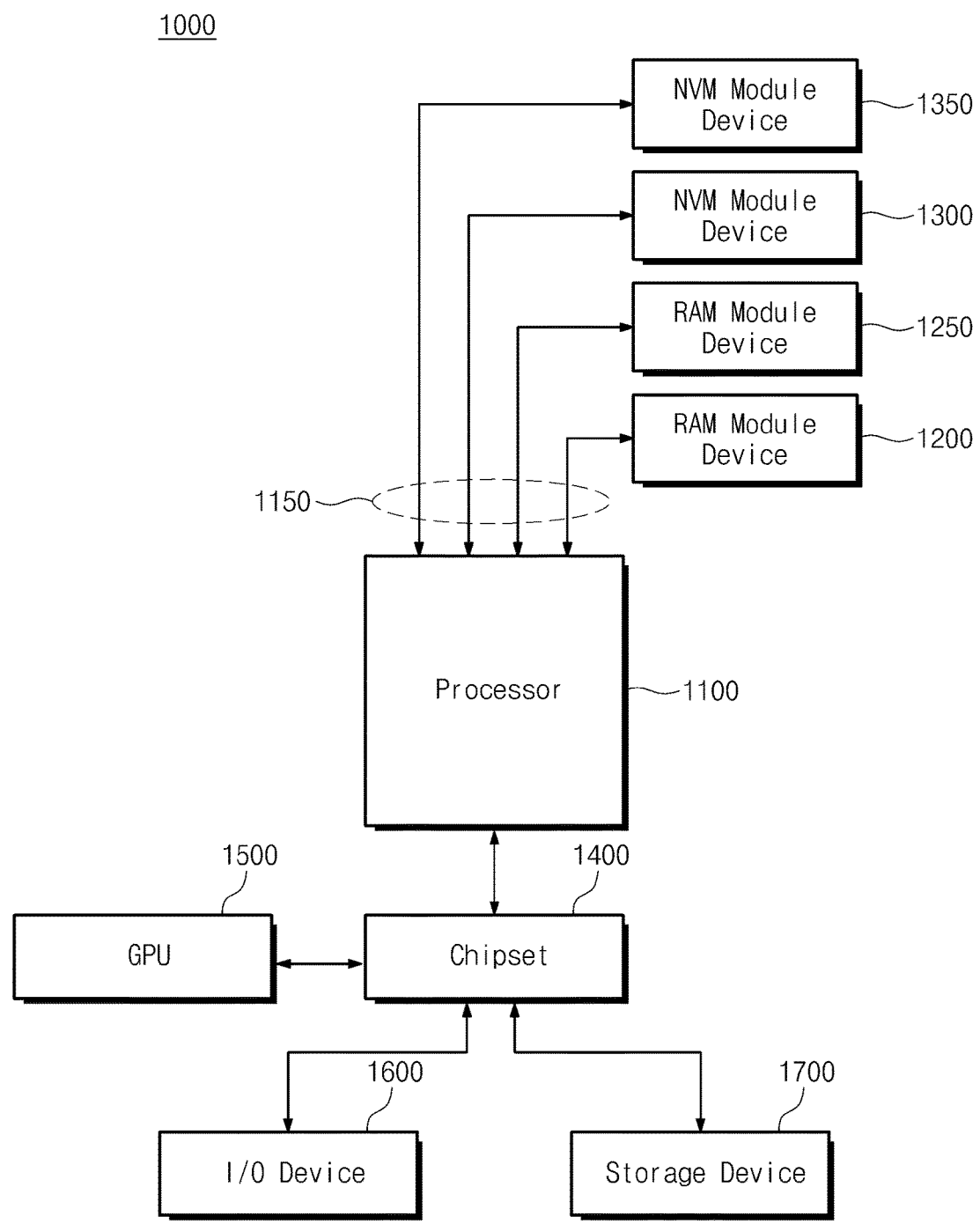
FIG. 19 is a block diagram illustrating an embodiment of a computing system to which a nonvolatile memory module according to the disclosure is applied.

FIG. 19 is a block diagram illustrating a computing system to which a nonvolatile memory module according to the disclosure is applied. Referring to FIG. 19, a computing device 1000 may include a processor 1100, RAM modules 1200 and 1250, nonvolatile memory modules 1300 and 1350, a chip set 1400, a graphic processing unit (GPU) 1500, an input/output device 1600, and a storage device 1700.

The processor 1100 may control an overall operation of the computing system 1000. The processor 1100 may perform various operations to be executed on the computing system 1000.

The nonvolatile memory modules 1300 and 1350 and the RAM modules 1200 and 1250 may be directly connected with the processor 1100. For example, each of the nonvolatile memory modules 1300 and 1350 and the RAM modules 1200 and 1250 may have a form of a dual in-line memory module (DIMM) and may be mounted on a DIMM socket directly connected to the processor 1100 so as to communicate with the processor 1100. In an embodiment, the nonvolatile memory modules 1300 and 1350 may be implemented in the form of one of nonvolatile memory modules 120, 220, and 320 described with reference to FIGS. 1 to 16.

The nonvolatile memory modules 1300 and 1350 and the RAM modules 1200 and 1250 may communicate with the processor 1100 through the same interface 1150. For example, the nonvolatile memory modules 1300 and 1350 and the RAM modules 1200 and 1250 may communicate with each other through the double data rate (DDR) interface 1150. In an embodiment, the processor 1100 may use the RAM modules 1200 and 1250 as a working memory, a buffer memory, or a cache memory of the computing system 1000.

The chipset 1400 may be electrically connected with the processor 1100 and may control hardware of the computing system 1000 under control of the processor 1100. For example, the chipset 1400 may be connected to each of the GPU 1500, the input/output device 1600, and the storage device 1700 through main buses and may perform a bridge operation with respect to the main buses.

The GPU 1500 may perform a set of arithmetic operations for outputting image data of the computing system 1000. In an example embodiment, the GPU 1500 may be embedded in the processor 1100 in the form of a system on chip.

The input/output device 1600 may include various devices which input data or commands for the computing system 1000 or may output data to an external device. For example, the input/output device 1600 may include user input devices such as a keyboard, a keypad, a button, a touch panel, a touch screen, a touch pad, a touch ball, a microphone, a gyroscope sensor, a vibration sensor, a piezoelectric sensor, and the like and user output devices such as a liquid crystal display (LCD), an organic light emitting diode (OLED) display device, an active matrix OLED (AMOLED) display device, a light emitting diode, a speaker, a motor, and the like.

The storage device 1700 may be used as a storage medium of the computing system 1000. The storage device 1700 may include mass storage media such as a hard disk drive (HDD), a solid state drive (SSD), a memory card, a memory stick, and the like.

In an example embodiment, the nonvolatile memory modules 1300 and 1350 may be used as a storage medium or a working memory of the computing system 1000 through the processor 1100. An interface 1150 between the nonvolatile memory modules 1300 and 1350 and the processor 1100 may be faster in speed than that between the storage device 1700 and the processor 1100. That is, the processor 1100 may use the nonvolatile memory modules 1300 and 1350 as a storage medium, thereby improving the performance of the computing system 3000.

Each of the nonvolatile memory modules 1300 and 1350 as described above may back-up data stored in a DRAM in a nonvolatile memory in response to a request of the processor 1100 or based on an internal detection of a power error. Each of DRAMs included in the nonvolatile memory modules 1300 and 1350 may include a first input/output port for exchanging data with a host and a second input/output port for transmitting data to the nonvolatile memory for back-up.

Figure 20:
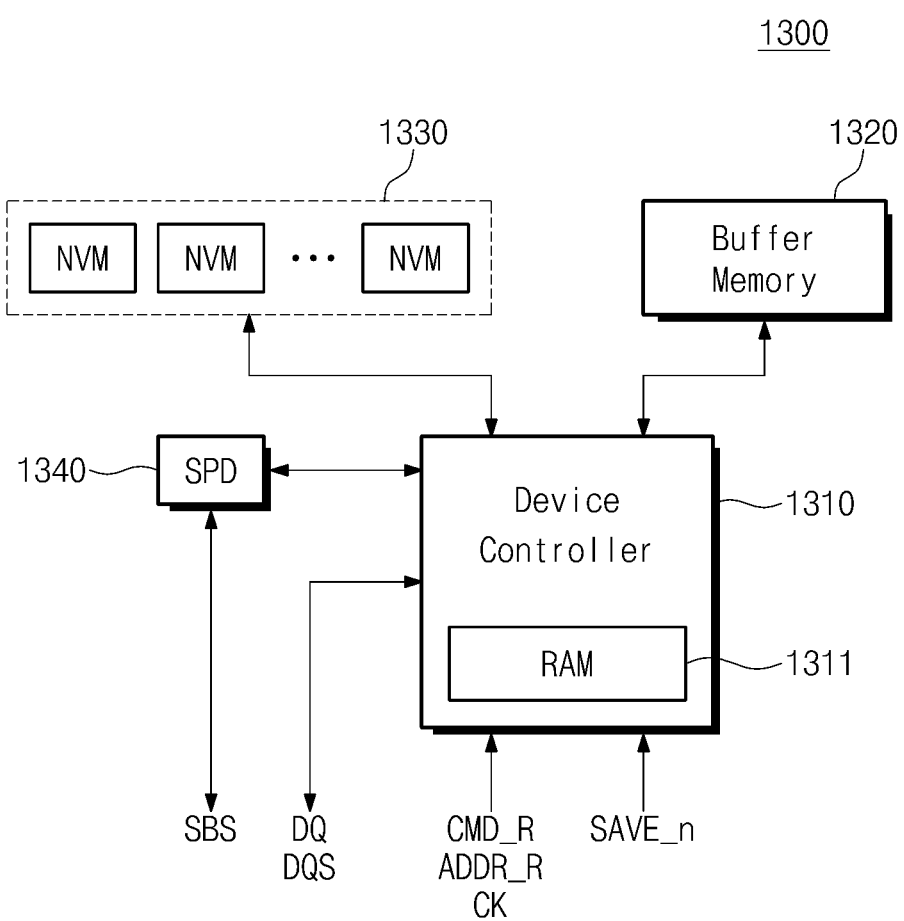
FIG. 20 is a block diagram illustrating an embodiment of one of the nonvolatile memory modules of FIG. 19.

FIG. 20 is a block diagram illustrating one of nonvolatile memory modules of FIG. 19. In an example embodiment, FIG. 20 is a block diagram of a nonvolatile memory module 1300 with a registered DIMM (RDIMM) form. In an example embodiment, the nonvolatile memory module 1300 illustrated in FIG. 20 may be of the form of a dual in-line memory module (DIMM) and may be mounted on a DIMM socket so as to communicate with the processor 1100.

Referring to FIG. 20, the nonvolatile memory module 1300 may include a device controller 1310, a buffer memory 1320, a nonvolatile memory device 1330, and a serial presence detect chip (SPD) 1340. The device controller 1310 may include a RAM 1311. In an embodiment, the nonvolatile memory device 1330 may include a plurality of nonvolatile memories NVM. Each of the nonvolatile memories included in the nonvolatile memory device 1330 may be implemented with a chip, a package, a device, or a module. Alternatively, the nonvolatile memory device 1330 may be implemented with a chip or a package.

The device controller 1310 may back-up data stored in the buffer memory 1320 in the nonvolatile memory 1330 in response to a control signal SAVE_n or a command from the processor 1100. The buffer memory 1320 may include the back-up channel as well as a channel for exchanging data with the processor 1100.

The SPD 1340 may be a programmable read only memory device (e.g., EEPROM). The SPD 1340 may include initial information or device information of the nonvolatile memory module 1300. In an example embodiment, the SPD 1340 may include initial information or device information, such as a module type, a module configuration, a storage capacity, a module kind, an execution environment, and the like, of the nonvolatile memory module 1300. When a computing system including the nonvolatile memory module 1300 is booted up, the processor 1100 of the computing system may read the SPD 1340 and may recognize the nonvolatile memory module 1300 based on the read result. The processor 1100 may use the nonvolatile memory module 1300 as a storage medium based on the SPD 1340.

In an example embodiment, the SPD 1340 may communicate with the processor 1100 through a side-band communication channel. The processor 1100 may exchange a side-band signal SBS with the SPD 1340 through the side-band communication channel. In an example embodiment, the SPD 1340 may communicate with the device controller 1310 through the side-band communication channel. In an example embodiment, the side-band communication channel may be an I2C communication based channel.

In an example embodiment, the SPD 1340, the device controller 1310, and the processor 1100 may communicate with each other through I2C communication or may exchange information with each other through the I2C communication.

Figure 21:
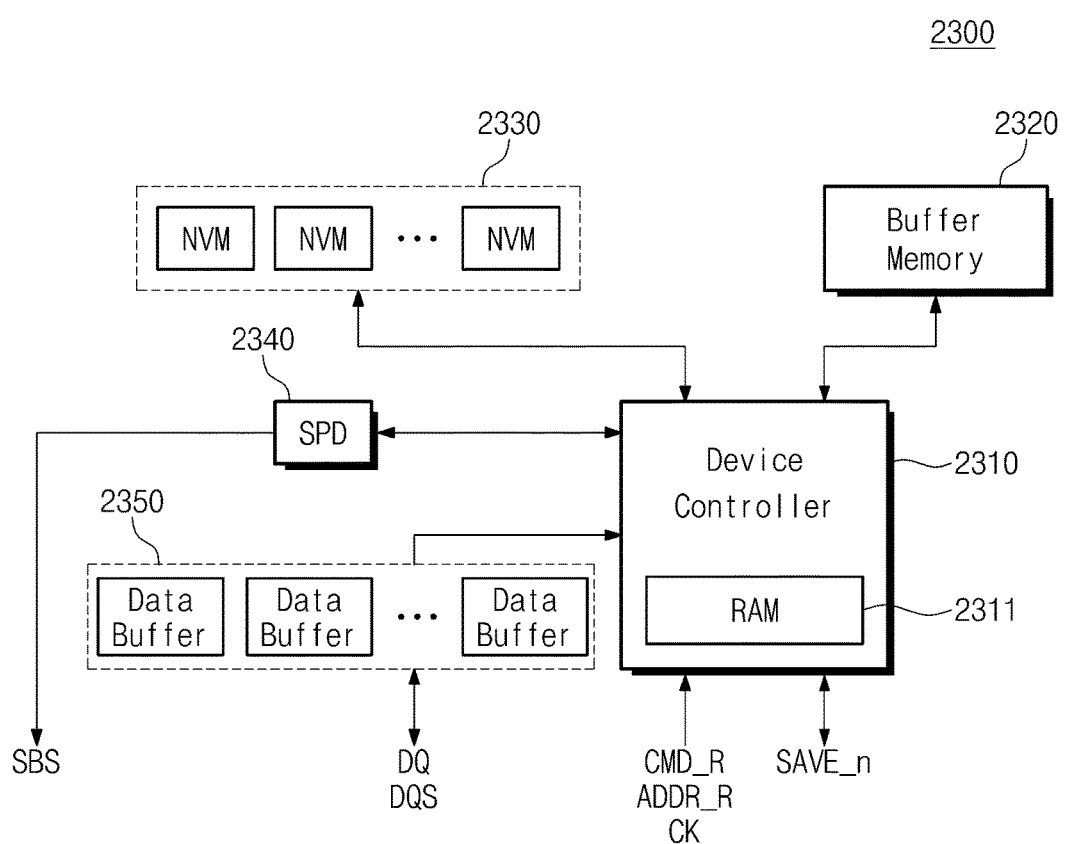
FIG. 21 is a block diagram illustrating an embodiment of one of the nonvolatile memory modules of FIG. 19.

FIG. 21 is a block diagram illustrating one of nonvolatile memory modules of FIG. 19. In an example embodiment, FIG. 21 is a block diagram of a nonvolatile memory module 2300 with a load reduced DIMM (LRDIMM) form. In an example embodiment, the nonvolatile memory module 2300 illustrated in FIG. 22 may be of the form of a dual in-line memory module (DIMM) and may be mounted on a DIMM socket so as to communicate with the processor 1100.

Referring to FIG. 21, the nonvolatile memory module 2300 may include a device controller 2310, a buffer memory 2320, a nonvolatile memory device 2330, a serial presence detect chip (SPD) 2340, and a data buffer circuit 2350. The device controller 2310 may include a RAM 2311. The device controller 2310, the RAM 2311, the nonvolatile memory device 2330, and the SPD 2340 are described with reference to FIG. 20, and a detailed description thereof is thus omitted.

The data buffer circuit 2350 may receive information or data from the processor 1100 (refer to FIG. 20) through a data signal DQ and a data strobe signal DQS and may transfer the received information or data to the device controller 2310. Alternatively, the data buffer circuit 2350 may receive information or data from the device controller 2310 and may transfer the received information or data to the processor 1100 through a data signal DQ and a data strobe signal DQS.

In an example embodiment, the data buffer circuit 2350 may include a plurality of data buffers. Each of the data buffers may exchange the data signal DQ and the data strobe signal DQS with the processor 1100. Alternatively, each of the data buffers may exchange a signal with the device controller 2310. In an example embodiment, each of the data buffers may operate according to control of the device controller 2310.

The device controller 2310 may back-up data stored in the buffer memory 2320 in the nonvolatile memory 2330 in response to a control signal SAVE_n or a command from the processor 1100. The buffer memory 2320 may include the back-up channel as well as a channel for exchanging data with the processor 1100.

Figure 22:
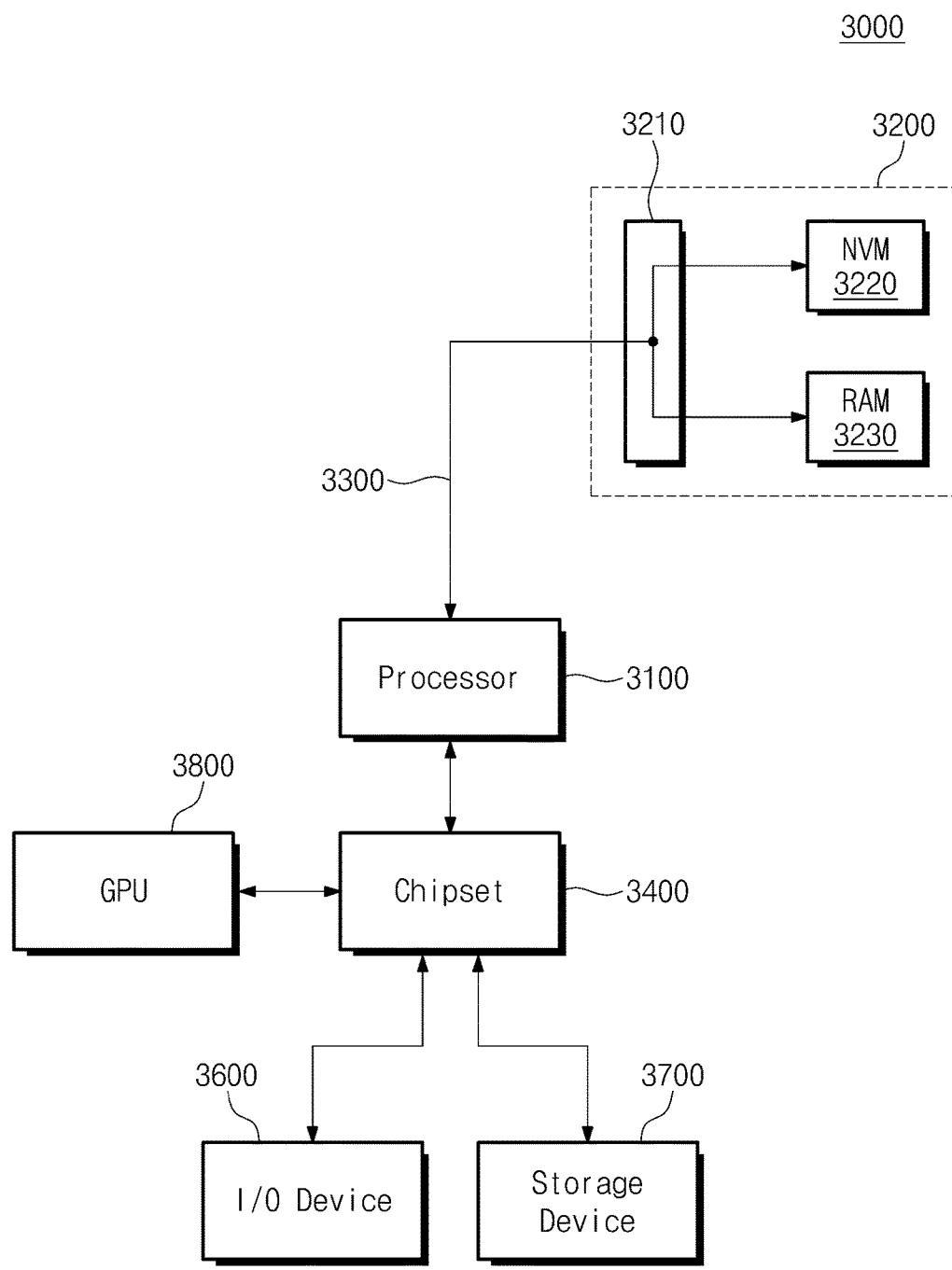
FIG. 22 is a block diagram illustrating an embodiment of a computing system to which a nonvolatile memory module according to the disclosure is applied.

FIG. 22 is a block diagram illustrating a computing system to which a nonvolatile memory module according to the disclosure is applied. For descriptive convenience, a detailed description about above-described components may be omitted. Referring to FIG. 22, a computing system 3000 may include a processor 3100, a nonvolatile memory module 3200, a chipset 3400, a graphic processing unit (GPU) 3500, an input/output device 3600, and a storage device 3700. The processor 3100, the chipset 3400, the GPU 3800, the input/output device 3600, and the storage device 3700 are substantially the same as those of FIG. 19, and a detailed description thereof is thus omitted.

The nonvolatile memory module 3200 may be directly connected to the processor 3100. In an example embodiment, the nonvolatile memory module 3200 may be of the form of a dual in-line memory module (DIMM) and may be mounted on a DIMM socket so as to communicate with the processor 3100.

The nonvolatile memory module 3200 may include a control circuit 3210, a nonvolatile memory device 3220, and a RAM device 3230. Unlike the nonvolatile memory modules 1300 and 2300 described with reference to FIGS. 20 and 21, the processor 3100 may access each of the nonvolatile memory device 3220 and the RAM device 3230 of the nonvolatile memory module 3200. In detail, the control circuit 3210 may store data received under control of the processor 3100 in the nonvolatile memory device 3220 or the RAM device 3230. Alternatively, the control circuit 3210 may transmit data stored in the nonvolatile memory device 3220 or data stored in the RAM device 3230 to the processor 3100 under control of the processor 3100. That is, the processor 3100 may recognize each of the nonvolatile memory device 3220 and the RAM device 3230 included in the nonvolatile memory module 3200. The processor 3100 may store data in the nonvolatile memory device 3220 of the nonvolatile memory module 3200 or may read data therefrom through communication channel 3300. Alternatively, the processor 3100 may store data in the RAM device 3230 or may read the stored data therefrom through communication channel 3300.

In an example embodiment, the processor 3100 may use the nonvolatile memory device 3220 of the nonvolatile memory module 3200 as a storage medium of the computing system 3000 and may use the RAM device 3230 of the nonvolatile memory module 3200 as a main memory of the computing system 3000. That is, the processor 3100 may selectively access each of the nonvolatile memory device 3220 and the RAM device 3230 included in a memory module which is mounted on one DIMM socket.

Here, the RAM device 3230 may include a first channel for communicating with the processor 3100 and a second channel for backing data up in the nonvolatile memory device 3220.

Figure 23:
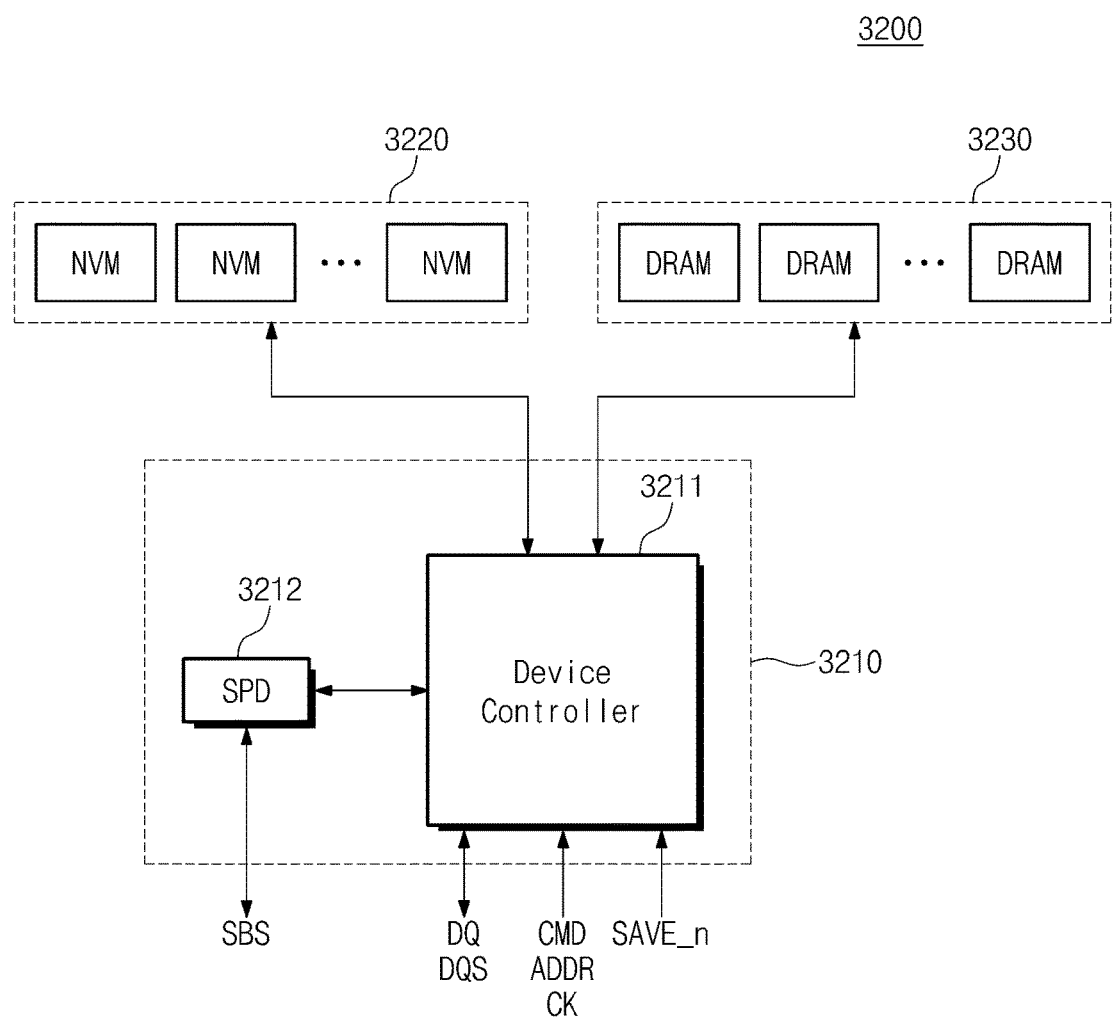
FIG. 23 is a block diagram illustrating an embodiment of a nonvolatile memory module illustrated in FIG. 22.

FIG. 23 is a block diagram illustrating an example embodiment of the nonvolatile memory module illustrated in FIG. 22. Referring to FIG. 23, the nonvolatile memory module 3200 may include a control circuit 3210, a nonvolatile memory device 3220, and a RAM device 3230. In an example embodiment, the nonvolatile memory device 3220 may include a plurality of nonvolatile memories, and the RAM device 3230 may include a plurality of DRAMs. In an example embodiment, a plurality of nonvolatile memories may be used as storage of the computing system 3000 by the processor 3100. In an example embodiment, each of the nonvolatile memories may include nonvolatile memory elements such as an electrically erasable and Programmable ROM (EEPROM), a NAND flash memory, a phase-change RAM (PRAM), a resistive RAM (ReRAM), a ferroelectric RAM (FRAM), a spin-torque magnetic RAM (STT-MRAM), and the like.

The DRAMs may be used as a main memory of the computing system 3000 by the processor 3100. In an example embodiment, the RAM device 3230 may include random access memory elements such as a DRAM, an SRAM, an SDRAM, a PRAM, an ReRAM, a FRAM, an MRAM, and the like.

The control circuit 3210 may include a device controller 3211 and an SPD chip 3212. The device controller 3211 may receive a command CMD, an address ADDR, and a clock CK from the processor 3100. The device controller 3211 may selectively store data, received through the data signal DQ and the data strobe signal DQS, in the nonvolatile memory device 3220 or the RAM device 3230 in response to signals received from the processor 3100. Alternatively, the device controller 3211 may selectively transfer data, stored in the nonvolatile memory device 3220 or the RAM device 3230, to the processor 3100 through the data signal DQ and the data strobe signal DQS in response to signals received from the processor 3100.

In an example embodiment, the processor 3100 may selectively access the nonvolatile memory device 3220 or the RAM device 3230 through a command CMD, an address ADDR, or separate signal or information. That is, the processor 3100 may selectively access the nonvolatile memory device 3220 or the RAM device 3230 included in the nonvolatile memory module 3200. The RAM device 3230 may include a first channel for communicating with the processor 3100 and a second channel for back-up. The device controller 3211 may perform a back-up operation through the second channel of the RAM device 3230 in response to a request of the processor 3100 or based on an automatic status detection operation thereof.

Figure 24:
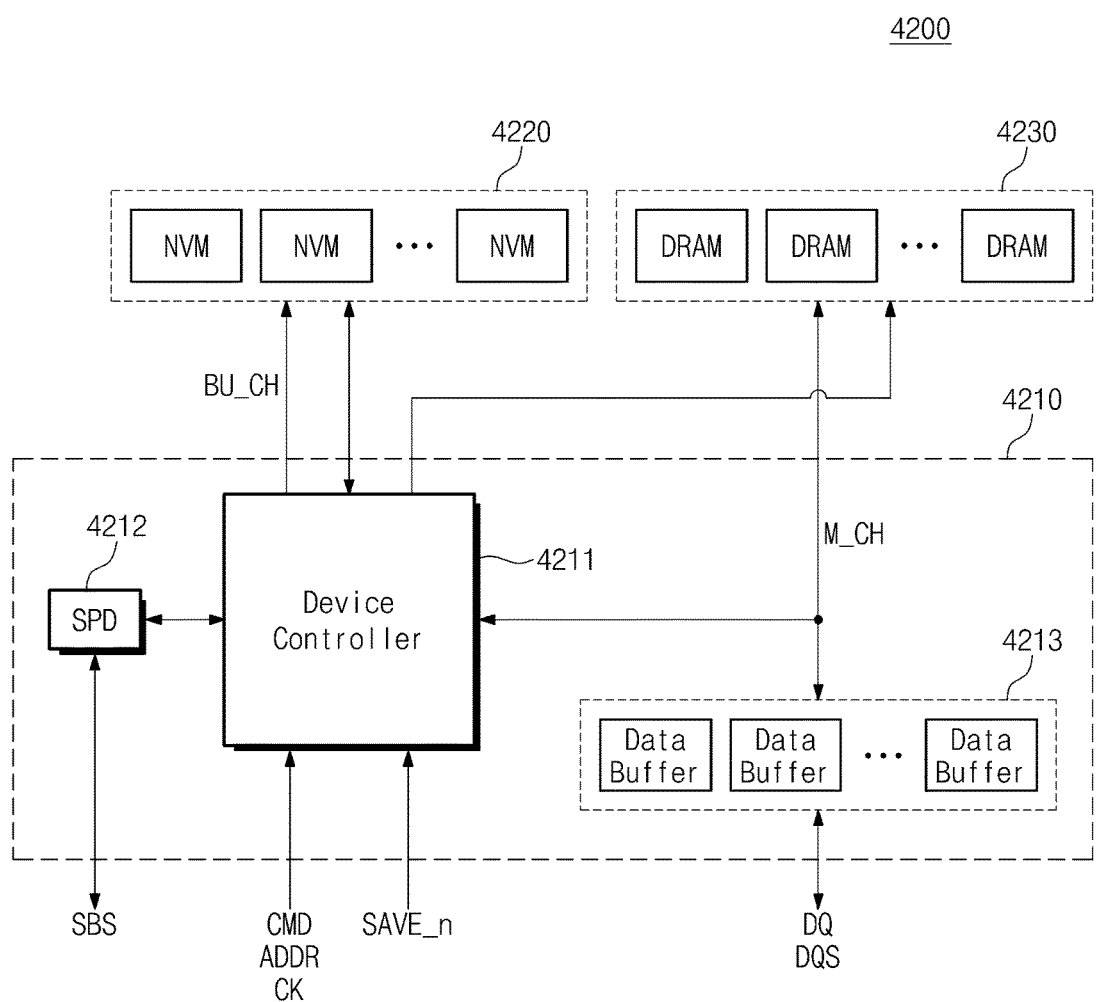
FIG. 24 is a block diagram illustrating an embodiment of a nonvolatile memory module illustrated in FIG. 22.

FIG. 24 is a block diagram illustrating an example embodiment of the nonvolatile memory module illustrated in FIG. 22. In an example embodiment, a nonvolatile memory module 4200 illustrated in FIG. 24 may be of the form of a dual in-line memory module (DIMM) and may be mounted on a DIMM socket so as to communicate with the processor 3100. Referring to FIG. 24, a nonvolatile memory module 4200 may include a control circuit 4210, a nonvolatile memory device 4220, and a RAM device 4230. The control circuit 4210 may include a device controller 4211, an SPD 4212, and a data buffer circuit 4213. The RAM device 4230 may include the main channel M_CH connected with a data buffer 4213 and the back-up channel BU_CH used at a back-up operation.

The device controller 4211 may receive a command CMD, an address ADDR, and a clock CK from the processor 3100. The device controller 4211 may back-up data stored in the buffer memory 4230 in the nonvolatile memory 4220 in response to a control signal SAVE_n from the processor 3100 or an automatic status detection operation.

Figure 25:
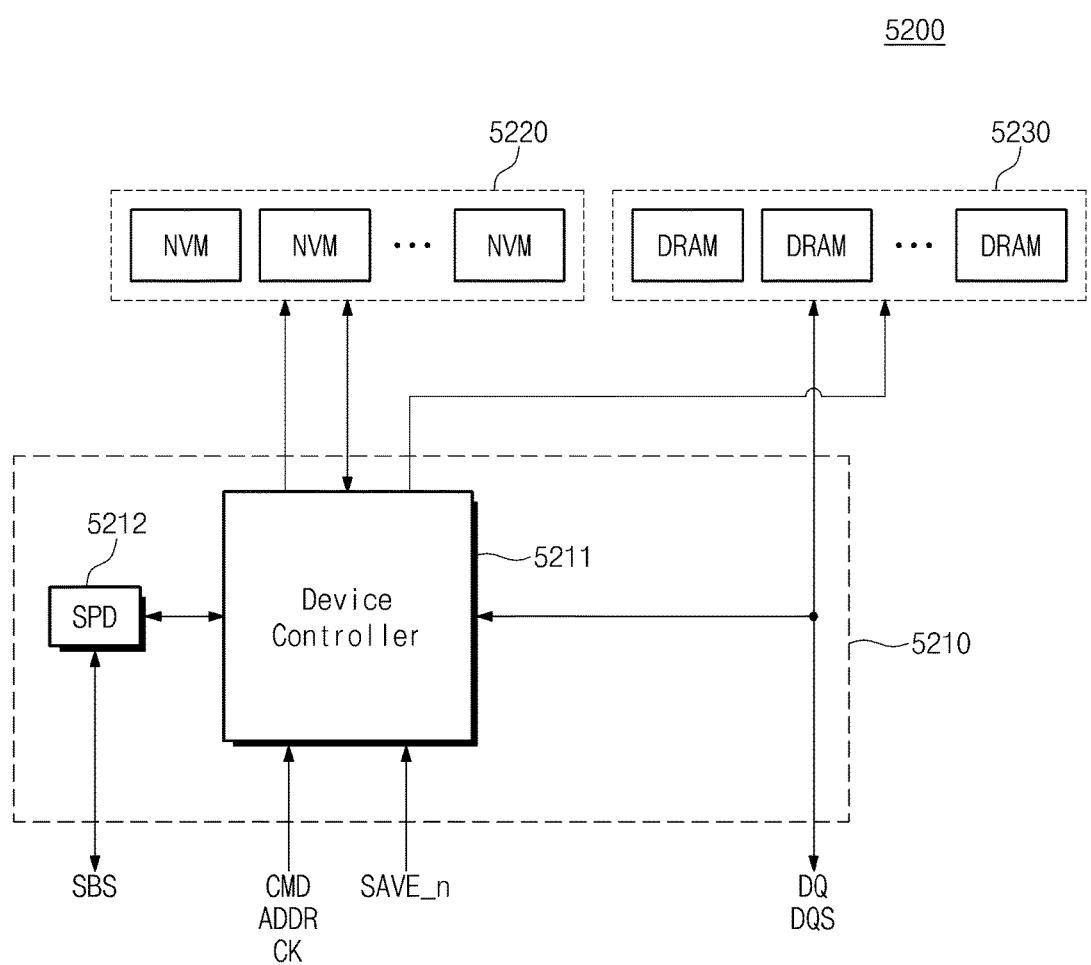
FIG. 25 is a block diagram illustrating an embodiment of a nonvolatile memory module illustrated in FIG. 22.

FIG. 25 is a block diagram illustrating an example embodiment of the nonvolatile memory module illustrated in FIG. 22. Referring to FIG. 25, a nonvolatile memory module 5200 may include a control circuit 5210, a nonvolatile memory device 5220, and a RAM device 5230. The control circuit 5210 may include a device controller 5211 and an SPD chip 5212. The nonvolatile memory module 5200 of FIG. 25 may operate to be similar to the nonvolatile memory module 4200 of FIG. 24. However, the nonvolatile memory module 5200 of FIG. 25 may not include the data buffer circuit 4213, unlike the nonvolatile memory module 4200 of FIG. 24. In an example embodiment, the nonvolatile memory module 4200 of FIG. 24 may be a memory module of a load reduced DIMM (LRDIMM) shape, and the nonvolatile memory module 5200 of FIG. 25 may be a memory module of a registered DIMM (RDIMM) shape.

Embodiments of the disclosure provide a nonvolatile memory module including a volatile memory module capable of easily composing a channel for a back-up/restore operation.

Accordingly, it may be possible to restore data easily at a situation, such as a power error. This may mean that the performance and reliability of a nonvolatile memory module are improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments, it will be apparent to those skilled in the art that various changes and modifications may be made without departing from the spirit and scope of the disclosure. Therefore, it should be understood that the above embodiments are not limiting, but illustrative.

What is claimed is:

1. A memory module comprising:
   a nonvolatile memory device;
   a volatile memory device connected to a first data channel through a first input/output port and to a second data channel through a second input/output port and configured to activate one of the first and second input/output ports based on an operation mode;
   a registering clock driver (RCD) configured to transmit at least one of a first control signal for data exchange through the first input/output port and a second control signal for data exchange through the second input/output port, to the volatile memory device; and
   a memory controller configured to generate the second control signal, to exchange data with the volatile memory device through the second data channel, and to control the nonvolatile memory device, wherein
   the memory controller detects a request from a host or a power status and generates the second control signal with reference to the detection result so as to activate the second input/output port of the volatile memory device.

2. The memory module of claim 1, wherein transmission bandwidths of the first and second input/output ports are different in size from each other.

3. The memory module of claim 1, wherein the first control signal comprises a command or address provided from the host.

4. The memory module of claim 1, wherein the second control signal comprises a command or address provided by the memory controller.

5. The memory module of claim 1, wherein the volatile memory comprises:
   a multiplexer configured to activate one of the first and second input/output ports in response to a selection signal; and
   a control logic configured to generate the selection signal based on the operation mode.

6. The memory module of claim 5, wherein each of the first and second input/output ports is connected to four data signal lines.

7. The memory module of claim 1, wherein the first data channel comprises a data buffer configured to exchange data with the host.

8. The memory module of claim 1, wherein the registering clock driver deactivates the first control signal when the second control signal is activated.

9. The memory module of claim 1, wherein the memory controller switches from power for back-up to an auxiliary power source in response to a control signal from the host and generates the second control signal for backing-up data loaded into the volatile memory device in the nonvolatile memory device.

10. The memory module of claim 1, wherein the data exchange through the first or second input/output port is based on at least one of double data rate (DDR), DDR2, DDR3, DDR4, and low power DDR (LPDDR) protocols.

11. The memory module of claim 1, wherein the memory module is connected to the host in the form of a dual in-line memory module (DIMM).

12. The memory module of claim 1, wherein the nonvolatile memory device comprises a three-dimensional memory array.

13. A memory module comprising:
a nonvolatile memory device;
a dual-port dynamic random-access memory DRAM configured to activate one of first and second input/output ports for data input/output based on an operation mode;
a data buffer configured to connect the first input/output port to a main channel for data exchange with a host or the second input/output port to a back-up channel for back-up or restore;
a memory controller configured to exchange back-up data with the nonvolatile memory device through the back-up channel; and
a registering clock driver configured to selectively provide a command/address provided from the memory controller or the host to the dual-port DRAM based on the operation mode, wherein
the registering clock driver generates a buffer command for controlling a delay or transmission characteristic of the data buffer based on the operation mode.

14. The memory module of claim 13, wherein a transmission bandwidth of the second input/output port for a back-up operation mode is narrower than that of the first input/output port for a normal operation mode.

15. The memory module of claim 14, wherein the registering clock driver provides the data buffer with a buffer command for controlling a transmission characteristic between the second input/output port and the back-up channel for the back-up operation.

16. The memory module of claim 14, wherein each of the first and second input/output ports drives data in a manner corresponding to one of double data rate (DDR), DDR2, DDR3, and DDR4 protocols.

17. A volatile random access memory (RAM) comprising:
an array of memory cells that store data;
a first input/output port that communicates data with a host device according to a transmission bandwidth of the random access memory;
a second input/output port that communicates data with a nonvolatile memory (NVM) controller according to a transmission bandwidth of a nonvolatile memory device that is controlled by the nonvolatile memory controller; and
a RAM controller that communicates data between the memory cell array and the host device through the first input/output port in response to receiving a first command and communicates data between the memory cell array and the NVM controller in response to receiving a second command that differs from the first command.

18. The volatile random access memory of claim 17, further comprising a multiplexer that selectively communicates data between the memory cell array and each of the first input/output port and the second input/output port in accordance with respective first and second control instructions received from the RAM controller.

19. The volatile random access memory of claim 17, wherein the second command is received from the NVM controller and instructs the RAM controller to backup data stored by the memory cell array in the nonvolatile memory device controlled by the NVM controller.

20. The volatile random access memory of claim 17, wherein the second command instructs the RAM controller to restore data that was previously backed-up within the nonvolatile memory device, controlled by the NVM controller, to the memory cell array.

* * * * *